United States Patent
Ma et al.

(10) Patent No.: US 11,556,311 B2
(45) Date of Patent: Jan. 17, 2023

(54) RECONFIGURABLE INPUT PRECISION IN-MEMORY COMPUTING

(71) Applicant: SanDisk Technologies LLC, Addison, TX (US)

(72) Inventors: Wen Ma, Sunnyvale, CA (US); Pi-Feng Chiu, Milpitas, CA (US); Won Ho Choi, Santa Clara, CA (US); Martin Lueker-Boden, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 455 days.

(21) Appl. No.: 16/850,395

(22) Filed: Apr. 16, 2020

(65) Prior Publication Data

US 2021/0326110 A1    Oct. 21, 2021

(51) Int. Cl.
*G06F 7/52* (2006.01)
*G06F 7/523* (2006.01)
*G11C 13/00* (2006.01)
*G06N 3/04* (2006.01)

(52) U.S. Cl.
CPC ............ *G06F 7/523* (2013.01); *G11C 13/004* (2013.01); *G11C 13/0069* (2013.01); *G06N 3/04* (2013.01)

(58) Field of Classification Search
CPC ... G06F 7/523; G11C 13/004; G11C 13/0069; G06N 3/04
USPC ........................................................ 708/620
See application file for complete search history.

(56) References Cited

U.S. PATENT DOCUMENTS

| 10,528,643 | B1* | 1/2020 | Choi .................... G11C 7/1006 |
| 10,534,840 | B1 | 1/2020 | Petti |
| 2019/0272870 | A1 | 9/2019 | Choi et al. |
| 2020/0012924 | A1 | 1/2020 | Ma et al. |
| 2020/0034686 | A1 | 1/2020 | Chiu et al. |
| 2020/0034697 | A1 | 1/2020 | Choi et al. |
| 2020/0035305 | A1 | 1/2020 | Choi et al. |
| 2020/0193300 | A1* | 6/2020 | Kumar ................. G06N 3/0445 |

* cited by examiner

*Primary Examiner* — Vu A Le
(74) *Attorney, Agent, or Firm* — Vierra Magen Marcus LLP

(57) ABSTRACT

Technology for reconfigurable input precision in-memory computing is disclosed herein. Reconfigurable input precision allows the bit resolution of input data to be changed to meet the requirements of in-memory computing operations. Voltage sources (that may include DACs) provide voltages that represent input data to memory cell nodes. The resolution of the voltage sources may be reconfigured to change the precision of the input data. In one parallel mode, the number of DACs in a DAC node is used to configure the resolution. In one serial mode, the number of cycles over which a DAC provides voltages is used to configure the resolution. The memory system may include relatively low resolution voltage sources, which avoids the need to have complex high resolution voltage sources (e.g., high resolution DACs). Lower resolution voltage sources can take up less area and/or use less power than higher resolution voltage sources.

20 Claims, 24 Drawing Sheets

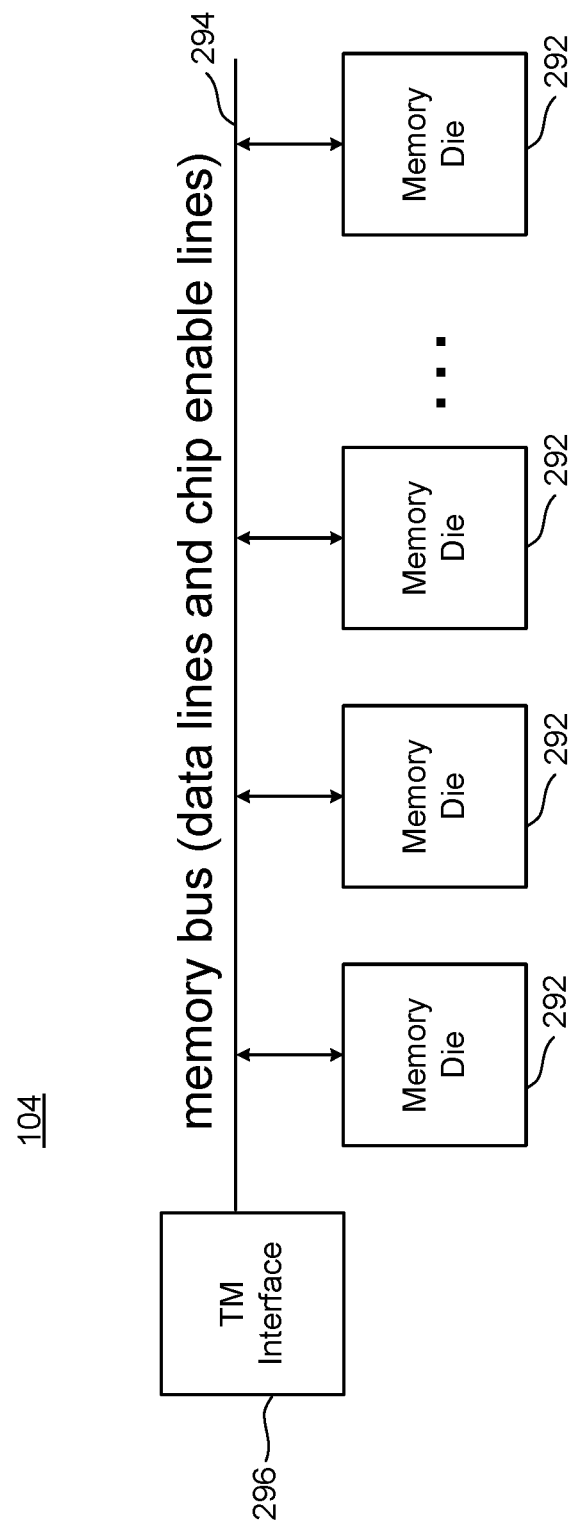

1100

| b4 | b3 | b2 | b1 | DAC A Output (V) | DAC B Output (V) | Collective Output (V) |
|---|---|---|---|---|---|---|
| 0 | 0 | 0 | 0 | 0 | 0 | 0 |
| 0 | 0 | 0 | 1 | Vread/16 | 0 | Vread/16 |
| 0 | 0 | 1 | 0 | Vread/8 | 0 | Vread/8 |
| 0 | 0 | 1 | 1 | 3*Vread/16 | 0 | 3*Vread/16 |
| 0 | 1 | 0 | 0 | 0 | Vread/4 | Vread/4 |
| 0 | 1 | 0 | 1 | Vread/16 | Vread/4 | 5*Vread/16 |
| 0 | 1 | 1 | 0 | Vread/8 | Vread/4 | 3*Vread/8 |
| 0 | 1 | 1 | 1 | 3*Vread/16 | Vread/4 | 7*Vread/16 |
| 1 | 0 | 0 | 0 | 0 | Vread/2 | Vread/2 |
| 1 | 0 | 0 | 1 | Vread/16 | Vread/2 | 9*Vread/16 |
| 1 | 0 | 1 | 0 | Vread/8 | Vread/2 | 5*Vread/8 |
| 1 | 0 | 1 | 1 | 3*Vread/16 | Vread/2 | 11*Vread/16 |
| 1 | 1 | 0 | 0 | 0 | 3*Vread/4 | 3*Vread/4 |
| 1 | 1 | 0 | 1 | Vread/16 | 3*Vread/4 | 13*Vread/16 |
| 1 | 1 | 1 | 0 | Vread/8 | 3*Vread/4 | 7*Vread/8 |
| 1 | 1 | 1 | 1 | 3*Vread/16 | 3*Vread/4 | 15*Vread/16 |

FIG. 11

RECONFIGURABLE INPUT PRECISION IN-MEMORY COMPUTING

BACKGROUND

Artificial neural networks are finding increasing usage in artificial intelligence and machine learning applications. In an artificial neural network, a set of inputs is propagated through one or more intermediate, or hidden, layers to generate an output. The layers connecting the input to the output are connected by sets of weights that are generated in a training or learning phase by determining a set of a mathematical manipulations to turn the input into the output, moving through the layers calculating the probability of each output. Once the weights are established, they can be used in the inference phase to determine the output from a se of inputs. Although such neural networks can provide highly accurate results, they are extremely computationally intensive, and the data transfers involved in reading the weights connecting the different layers out of memory and transferring them into the processing units of a processing unit can be quite intensive.

BRIEF DESCRIPTION OF THE DRAWING

Like-numbered elements refer to common components in the different figures.

FIG. 4 is a block diagram of one embodiment of a memory package.

FIG. 11 shows a table containing one embodiment of the mapping between the bits and the output voltages of the DACs in FIG. 10C.

DETAILED DESCRIPTION

Figure 1:
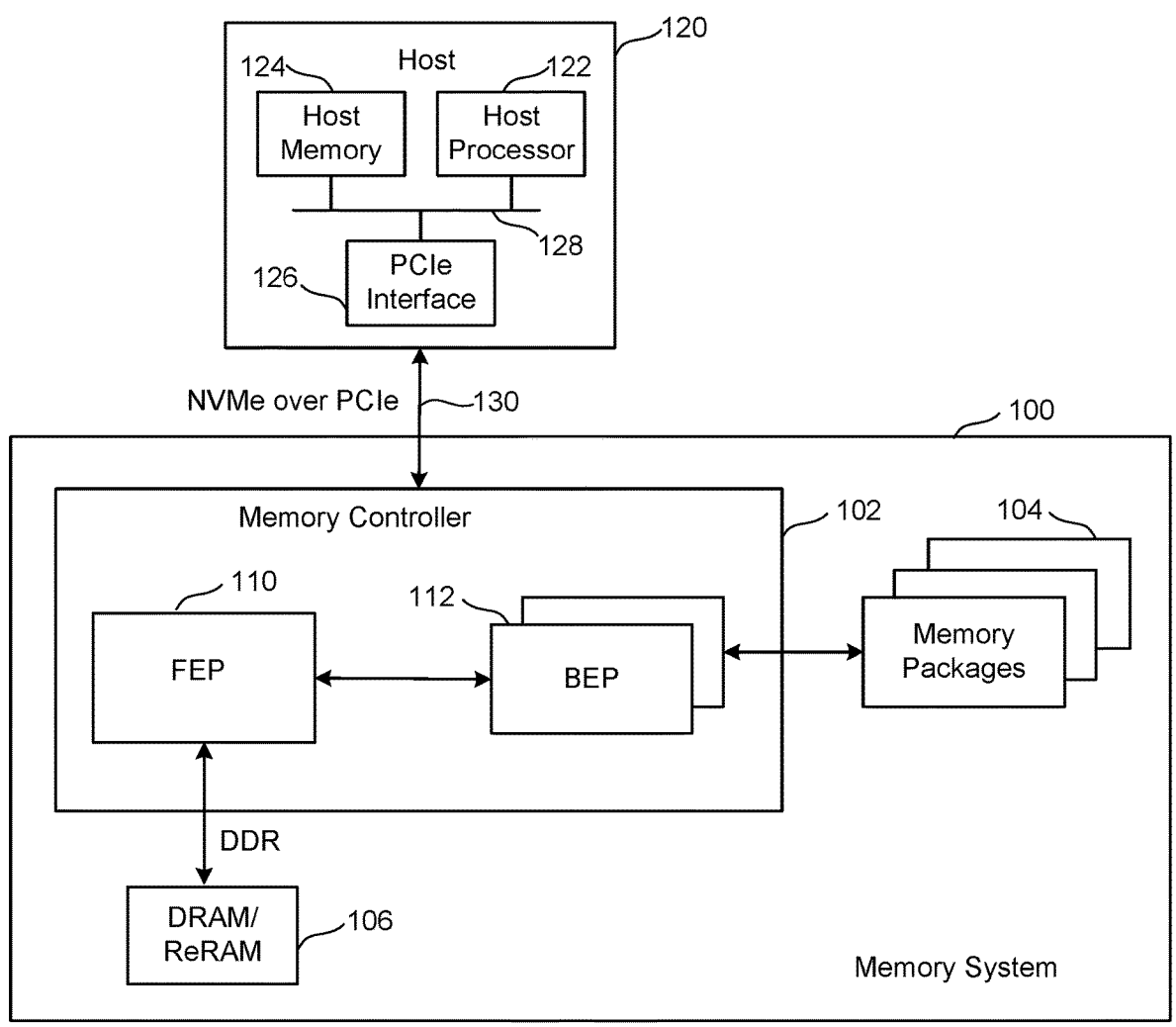
FIG. 1 is a block diagram of one embodiment of a memory system connected to a host.

Technology for reconfigurable input precision in-memory computing is disclosed herein. Input precision refers to the precision of input data for which in-memory computation is performed. For example, the input data could be a vector having data elements. In one embodiment, each data element is represented by a number of bits, which is referred to herein as a bit resolution. Reconfigurable input precision allows the bit resolution of the input data to be changed to meet the requirements of in-memory computing operations. Some in-memory computing operations may need higher precision, whereas for others a lower precision may suffice. For example, different types of algorithms that are used to implement an artificial neural network may require different precision for input data.

Embodiments of a memory system provide reconfigurable input precision for in-memory computing. Embodiments of a memory system include relatively low resolution voltage sources. The resolution of a voltage source may be stated in terms of the number of bits used to control the voltage source. The resolution of a voltage source may be stated in terms of the number of unique voltage magnitudes provided by the voltage source. For example, a 2-bit voltage source may provide four unique voltage magnitudes. The different voltage magnitudes may be used to represent input data. The voltage sources may include, for example, 2-bit resolution digital-to-analog converters (DACs). The voltage sources may be operated in a way that provides the resolution to be reconfigured. This avoids the need to have complex high resolution voltage sources (e.g., high resolution DACs). Also lower resolution voltage sources (e.g., low resolution DACs) can take up less area on a semiconductor die than higher resolution voltage sources. In some cases, low resolution voltage sources (e.g., low resolution DACs) may use less power than higher resolution voltage sources.

In some embodiments, in-memory computing includes multiplication using non-volatile memory cells. In one embodiment, vector/vector multiplication (e.g., vector dot product) is performed in a non-volatile memory system. A vector dot product is the summation of the products of the corresponding elements of two equal length vectors (where equal length refers to an equal number of elements). Hence, a vector dot product may also be referred to as a "multiply and accumulate" (MAC). In one embodiment, vector/matrix multiplication is performed in a non-volatile memory system. In one embodiment, non-volatile memory cells are used to perform multiplication in a neuromorphic computing system. A neuromorphic computing system may be used to implement an artificial neural network.

In some embodiments, multiplication is performed based on a state (e.g., resistance, threshold voltage) of a non-volatile memory cell and a voltage applied to the non-volatile memory cell. The multiplication result may be determined based on a magnitude of a memory cell current. In one embodiment, the memory cells are organized into memory cell nodes. Each memory cell node may contain one or more memory cells. In one embodiment, each memory cell node stores a value that is to be multiplied by a value represented by a voltage that represents input data. For example, a memory cell node may store a weight. In one embodiment, a column of memory cell nodes stores a vector. In one embodiment, multiple columns of memory cell nodes stores a matrix of weights (or "weight matrix").

In some embodiments, one or more digital-to-analog convertors (DAC) are used to generate a voltage that is applied to a memory cell node. In some embodiments, the resolution of the voltage that is applied to the memory cell node is configurable. Herein, the resolution of a voltage provided to a memory cell node means the number of unique voltage magnitudes that can be provided to the memory cell node. For example, the DACs may each input an n-bit digital control signal and one or more voltages. Each DAC may output 2^n unique output voltage magnitudes based on the n-bit digital signal and the one or more voltages. In some embodiments, n is a relatively low number, such that the DACs have low complexity. For example, the DAC may input a 2-bit digital control signal and may output a voltage that has one of four unique magnitudes.

In one embodiment, multiple DACs are grouped together to provide the voltages to a memory cell node to allow the collective resolution of the DACs to be reconfigured. Moreover, the size of the memory cell nodes may be changed to facilitate the change in resolution. For example, if each DAC individually is capable of generating four unique voltage values, then those four unique voltage values may be provided to a memory cell node. If two DACs are used to provide voltages to a memory cell node, then two DACs may be used to collectively generate sixteen unique voltage values for the memory cell node, thereby providing for 4-bit resolution. To further elaborate, if a 2-bit digital control signal is used to control a single DAC to generate four unique voltage values for a memory cell node, then a 4-bit digital control signal may be used to control two DACs to collectively generate sixteen unique voltage values for a memory cell node. Therefore, relatively low resolution DACs may be used to provide a variety of resolutions, including resolutions that are higher than any individual DAC can provide. Thus, the memory system may use relatively low complexity DACs to provide a variety of resolutions.

In one embodiment, a single DACs is operated over one or more cycles to provide the voltages to a memory cell node to allow the resolution of the DAC to be reconfigured. In this example, the size of the memory cell nodes need not be changed to facilitate the change in resolution. For example, if each DAC individually is capable of generating four unique voltage values, then those four unique voltage values may be provided to a memory cell node over one cycle. If the DAC is operated over two cycles, then the DAC may provide sixteen unique voltage values for the memory cell node over the two cycles, thereby providing for 4-bit resolution. To further elaborate, if a 2-bit digital control signal is used to control a single DAC to generate four unique voltage values for a memory cell node, then a 4-bit digital control signal may be used to control the DAC over two cycles to generate sixteen unique voltage values for a memory cell node. Therefore, relatively low resolution DACs may be used to provide a variety of resolutions, including resolutions that are higher than any individual DAC can provide. Thus, the memory system may use relatively low complexity DACs to provide a variety of resolutions.

In some embodiments, each memory cell in the node is programmed to one of two physical states. Herein, a "physical state" may be referred to more briefly as a "state." In some embodiments, one state may be referred to as an "on-state" and the other state as an "off-state." The on-state is a "high current state," whereas the off-state is a "low current state," in one embodiment. In one embodiment, the on-state is a "low resistance state," whereas the off-state is a "high resistance state." One state may be used to store a "1" and the other to store a "0." Thus, in some embodiments, each memory cell stores one bit of information.

In one embodiment, the memory cells in the memory cell nodes are "binary non-volatile memory cells." A "binary non-volatile memory cell," as the term is defined herein, is a non-volatile memory cell that can be repeatedly switched between two physical states. Some types of non-volatile memory cells are well-suited for use as binary non-volatile memory cells, although they may not be well-suited for use to store multiple bits per memory cell. For example, some memory cells having a ferroelectric field effect transistor (FeFET) are well-suited for use as binary non-volatile memory cells. Also, some magnetoresistive memory (e.g., MRAM) is well-suited for use as binary non-volatile memory cells. However, some FeFETs and MRAM are not well-suitable for use as multi-state non-volatile memory cells.

FIGS. 1-5C depict a memory system in which embodiments of in-memory computing may be performed. FIG. 1 is a block diagram of one embodiment of a memory system 100 connected to a host 120. Memory system 100 can implement the technology proposed herein. In one embodiment, neural network inputs or other data are received from the host 120. Depending on the embodiment, the inputs can be received from the host 120 and then provided to the memory packages 104 for inferencing on the weights programmed into the memory arrays of the memory packages 104. Many different types of memory systems can be used with the technology proposed herein. Example memory systems include solid state drives ("SSDs"), memory cards and embedded memory devices; however, other types of memory systems can also be used.

Memory system 100 of FIG. 1 comprises a Memory Controller 102, memory packages 104 (which may contain non-volatile memory) for storing data, and local memory (e.g. DRAM/ReRAM) 106. Memory Controller 102 comprises a Front End Processor (FEP) circuit 110 and one or more Back End Processor (BEP) circuits 112. In one embodiment FEP circuit 110 is implemented on an ASIC. In one embodiment, each BEP circuit 112 is implemented on a separate ASIC. In other embodiments, a unified controller ASIC can combine both the front end and back end functions. The ASICs for each of the BEP circuits 112 and the FEP circuit 110 are implemented on the same semiconductor such that the Controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a Flash Translation Layer (FTL) or Media Management Layer (MML) that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages.

In one embodiment, there are a plurality of memory packages 104. Each memory package includes one or more memory die. Therefore, Memory Controller 102 is connected to one or more non-volatile memory die. In one embodiment, each memory die in the memory packages 104 utilize NAND flash memory (including two dimensional NAND flash memory and/or three dimensional NAND flash memory). In other embodiments, the memory package can include other types of memory.

Memory Controller 102 communicates with host 120 via an interface 130 that implements NVM Express (NVMe) over PCI Express (PCIe). For working with memory system 100, host 120 includes a host processor 122, host memory 124, and a PCIe interface 126 connected along bus 128. Host memory 124 is the host's physical memory, and can be DRAM, SRAM, non-volatile memory or another type of storage. Host 120 is external to and separate from memory system 100. In one embodiment, memory system 100 is embedded in host 120.

Figure 2:
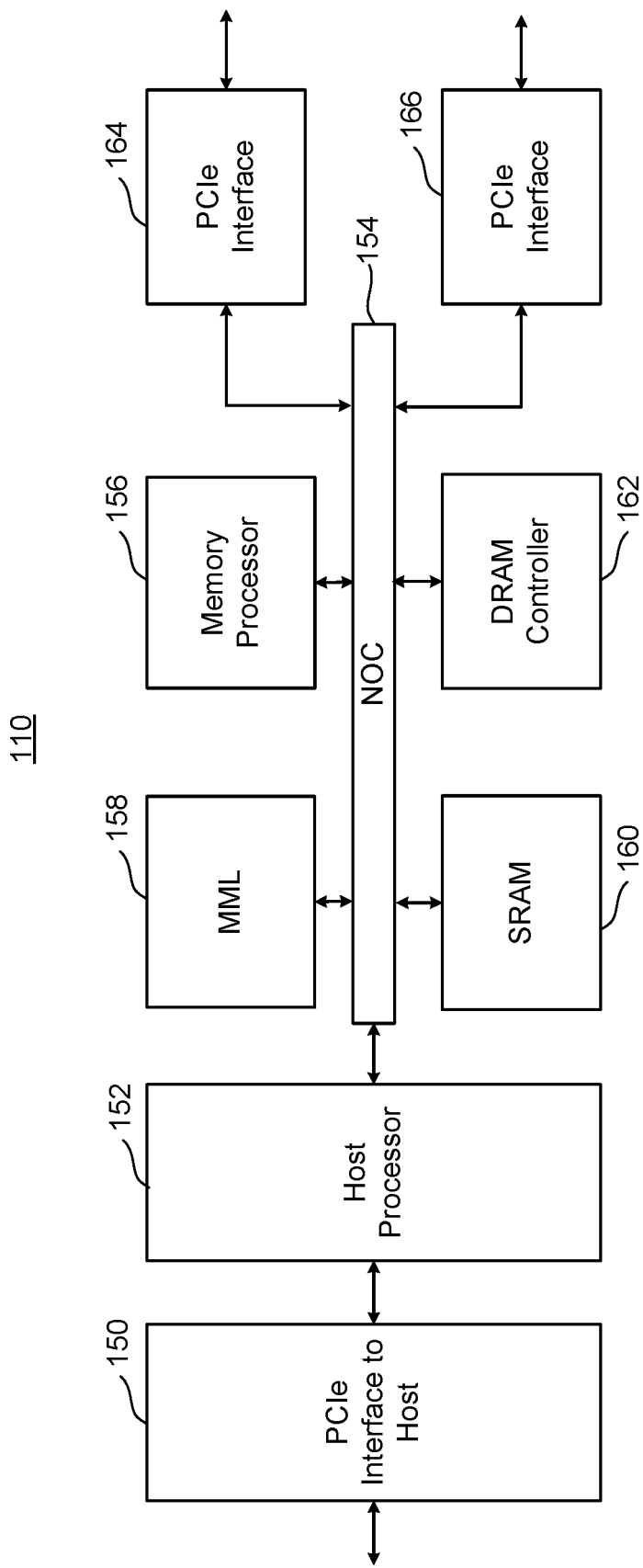
FIG. 2 is a block diagram of one embodiment of a Front End Processor Circuit. In some embodiments, the Front End Processor Circuit is part of a Memory Controller.

FIG. 2 is a block diagram of one embodiment of FEP circuit 110. FIG. 2 shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOCs can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also, in communication with the NOC are two PCIe Interfaces 164 and 166. In the embodiment of FIG. 2, the SSD controller will include two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

FEP circuit 110 can also include a Flash Translation Layer (FTL) or, more generally, a Media Management Layer (MML) 158 that performs memory management (e.g., garbage collection, wear leveling, load balancing, etc.), logical to physical address translation, communication with the host, management of DRAM (local volatile memory) and management of the overall operation of the SSD or other non-volatile storage system. The media management layer MML 158 may be integrated as part of the memory management that may handle memory errors and interfacing with the host. In particular, MML may be a module in the FEP circuit 110 and may be responsible for the internals of memory management. In particular, the MML 158 may include an algorithm in the memory device firmware which translates writes from the host into writes to the memory structure (e.g., 506 of FIG. 5A below) of a die. The MML 158 may be needed because: 1) the memory may have limited endurance; 2) the memory structure may only be written in multiples of pages; and/or 3) the memory structure may not be written unless it is erased as a block. The MML 158 understands these potential limitations of the memory structure which may not be visible to the host. Accordingly, the MML 158 attempts to translate the writes from host into writes into the memory structure.

Figure 3:
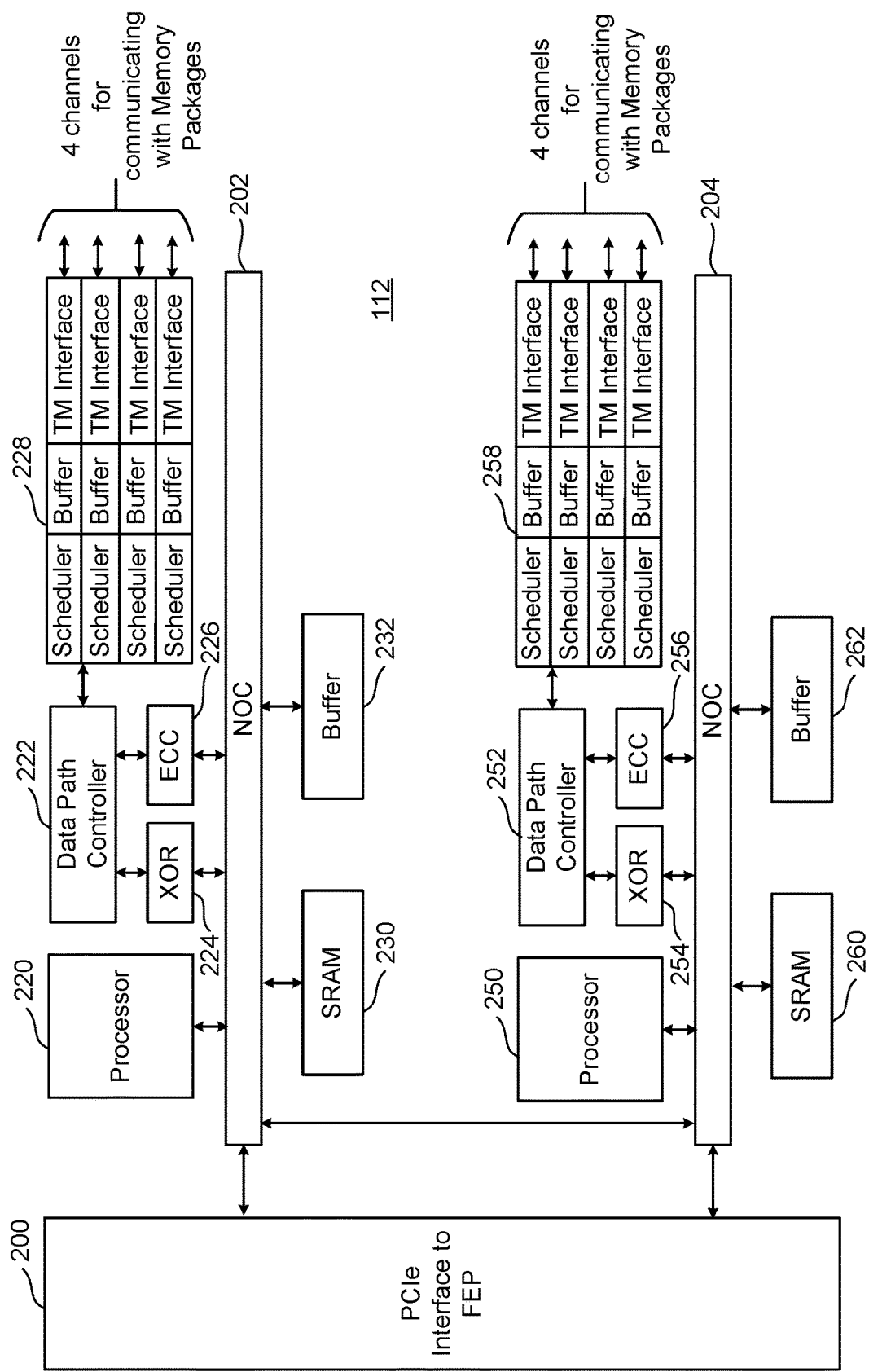
FIG. 3 is a block diagram of one embodiment of a Back End Processor Circuit. In some embodiments, the Back End Processor Circuit is part of a Memory Controller.

FIG. 3 is a block diagram of one embodiment of the BEP circuit 112. FIG. 3 shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined into one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 222 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

FIG. 4 is a block diagram of one embodiment of a memory package 104 that includes a plurality of memory die 292 connected to a memory bus (data lines and chip enable lines) 294. The memory bus 294 connects to a Toggle Mode Interface 296 for communicating with the TM Interface of a BEP circuit 112 (see e.g., FIG. 3). In some embodiments, the memory package can include a small controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die.

Memory controller 102 may include one or more state machines, page registers, SRAM, and control circuitry for controlling the operation of memory die 292. The one or more state machines, page registers, SRAM, and control circuitry for controlling the operation of memory die 292 may be referred to as managing or control circuits. The managing or control circuits may facilitate one or more memory array operations, such as forming, erasing, programming, or reading (or sensing) operations. The managing or control circuits are used to perform multiplication using non-volatile memory cells, in one embodiment. Herein, multiplication will be referred to as a type of memory array operation.

In some embodiments, the managing or control circuits (or a portion of the managing or control circuits) for facilitating one or more memory array operations (including multiplication) may be integrated within memory die 292.

Figure 5A:
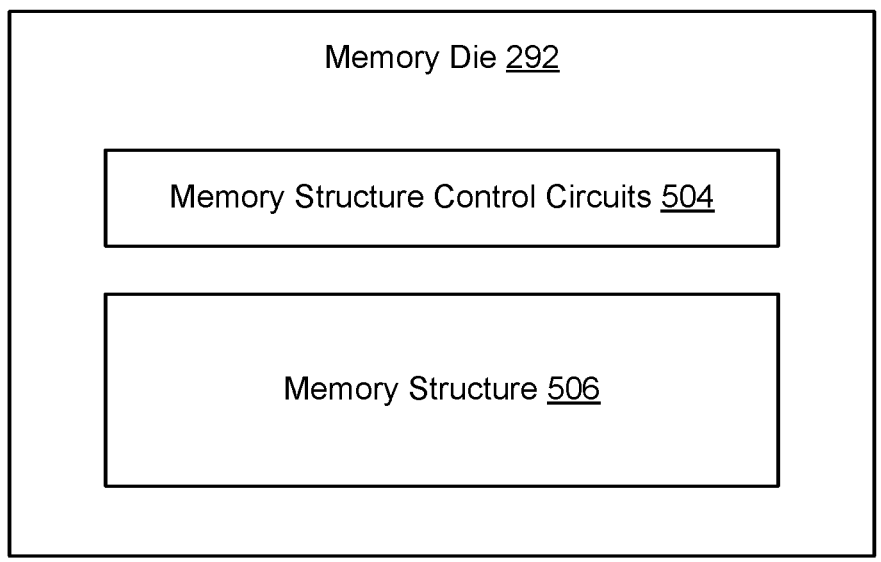
FIG. 5A depicts an embodiment of a memory die.

FIG. 5A depicts one embodiment of a memory die 292. Memory die 292 includes memory structure control circuits 504 and a memory structure 506. Memory structure control circuits 504 may include logic for controlling the selection of memory blocks (or arrays) within memory structure 506, controlling the generation of voltage references for biasing a particular memory array into a read or write state, or generating row and column addresses. Memory structure control circuits 504 may include logic for controlling the generation of voltage references for biasing a particular memory array in order to perform multiplication using non-volatile memory cells.

Memory controller 102 (see FIG. 1) controls operation of memory die 292. Once a read, write, or multiply operation is initiated by memory controller 102, memory structure control circuits 504 may generate the appropriate bias voltages for bit lines, source lines and/or word lines within memory structure 506, and generate the appropriate memory block, row, and column addresses.

In some embodiments, one or more managing or control circuits may be used for controlling the operation of a memory array. The one or more managing or control circuits may provide control signals to a memory array to perform a read operation, a write operation and/or a multiply operation on the memory array. In one example, the one or more managing or control circuits may include any one of or a combination of control circuitry, state machine, decoders, sense amplifiers, read/write/multiply circuits, and/or controllers. The one or more managing circuits may perform or facilitate one or more memory array operations including erasing, programming, reading operations, or multiply operations. In one example, one or more managing circuits may include an on-chip memory controller for determining row and column address, bit line, source line and word line addresses, memory array enable signals, and data latching signals.

Memory structure 506 may include one or more two-dimensional arrays of memory cells or one or more three-dimensional arrays of memory cells. In one embodiment, memory structure control circuits 504 and memory structure 506 are arranged on a single integrated circuit. In other embodiments, control circuits 504 (or a portion of memory structure control circuits 504) and memory structure 506 may be arranged on different integrated circuits.

In one embodiment, memory structure 506 comprises a three-dimensional memory array of non-volatile memory cells in which multiple memory levels are formed above a single substrate, such as a wafer. The memory structure may comprise any type of non-volatile memory that are monolithically formed in one or more physical levels of arrays of memory cells having an active area disposed above a silicon (or other type of) substrate.

The exact type of memory array architecture or memory cell included in memory structure 506 is not limited to the examples above. Many different types of memory array architectures or memory technologies can be used to form memory structure 506. No particular non-volatile memory technology is required for purposes of the new claimed embodiments proposed herein. Other examples of suitable technologies for memory cells of the memory structure 506 include ReRAM memories, ferroelectric field effect transistor (FeFET) memory, magnetoresistive memory (e.g., MRAM, Spin Transfer Torque MRAM, Spin Orbit Torque MRAM), phase change memory (e.g., PCM), and the like. Examples of suitable technologies for memory cell architectures of the memory structure 506 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A ferroelectric field effect transistor (FeFET) memory has an adjustable threshold voltage (Vt) transistor that has an adjustable threshold voltage. The adjustable Vt transistor has a low threshold voltage state and a high threshold voltage state, in one embodiment. The adjustable Vt transistor can be repeatedly switched between the low threshold voltage state and the high threshold voltage state.

In one embodiment, memory structure 506 comprises a three dimensional memory array of non-volatile memory cells in which multiple memory levels are formed above a single substrate, such as a wafer. The memory structure 506 may comprise any type of non-volatile memory that are monolithically formed in one or more physical levels of memory cells having an active area disposed above a silicon (or other type of) substrate. In one example, the non-volatile memory cells comprise vertical NAND strings with charge-trapping material such as described, for example, in U.S. Pat. No. 9,721,662, incorporated herein by reference in its entirety.

In another embodiment, memory structure 506 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

A person of ordinary skill in the art will recognize that the technology described herein is not limited to a single specific memory structure, but covers many relevant memory structures within the spirit and scope of the technology as described herein and as understood by one of ordinary skill in the art.

Figure 5B:
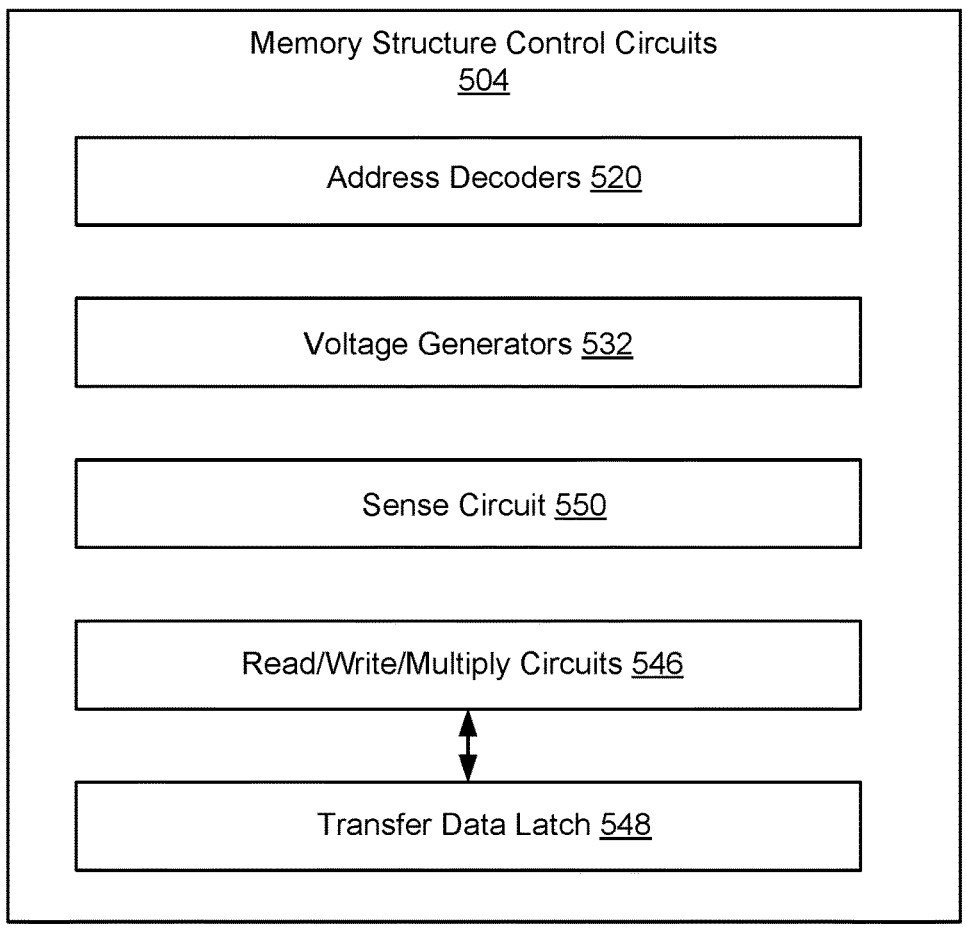
FIG. 5B depicts an embodiment of memory structure control circuits.

FIG. 5B depicts an embodiment of memory structure control circuits 504. As depicted, memory structure control circuits 504 include address decoders 520, voltage generators 532, transfer data latch 548, read/write/multiply circuits 546, and sense circuit 550. The voltage generators (or voltage regulators) 532 may generate voltages for control lines.

Read/write/multiply circuits 546 include circuitry for reading and writing memory cells in the memory structure 506. In an embodiment, transfer data latch 548 is used for intermediate storage between memory controller 102 (FIG. 1) and memory cells. In an embodiment, when host 120 instructs memory controller 102 to write data to memory die 292, memory controller 102 writes host data to transfer data latch 548. Read/write circuits 546 then write data from transfer data latch 548 to a specified page of memory cells. In an embodiment, transfer data latch 548 has a size equal to the size of a page. In an embodiment, when host 120 instructs memory controller 102 to read data from memory die 292, read/write circuits 546 read from a specified page into transfer data latch 548, and memory controller 102 transfers the read data from transfer data latch 548 to host 120. Address decoders 520 may generate memory block addresses, as well as row addresses and column addresses for a particular memory block.

The read/write/multiply circuits 546 also include circuitry for performing multiply operations using memory cells. In one embodiment, the multiply circuit is used to apply multiply voltages to memory cells that store multiplicands. Each multiply voltage has a magnitude that represents a multiplier, in one embodiment. Each memory cell in a node passes memory cell current in response to the multiply voltage. The magnitude of the memory cell current depends on the physical state of the memory cell and a magnitude of the multiply voltage, in one embodiment. For example, the magnitude of a memory cell current depends on the resistance of the memory cell and the voltage applied to the memory cell, in one embodiment. The magnitude of the memory cell current depends on whether the memory cell is in a first physical state or a second physical state, in one embodiment. Each physical state may be represented by a physical parameter including, but not limited to, a memory cell resistance, or a memory cell transistor threshold voltage.

The multiply voltage may cause the memory cell to pass the memory cell current without changing the physical state of the memory cell. However, whereas a read voltage may have a magnitude that is selected to delineate between physical states, the magnitude of the multiply voltage is not necessarily selected to delineate between physical states. The following examples of a memory cell programmed to one of two states will be used to illustrate. After a read voltage is applied, the memory cell current may be sensed and compared with a reference current to determine which state the memory cell is in. In this case, the magnitude of the read voltage and reference current may be selected to be able to delineate between the two states. However, the multiply voltage could have one of many different magnitudes, depending on what multiplier is desired. Moreover, the memory cell current that results from applying the multiply voltage is not necessarily compared to a reference current.

The sense circuit 550 is configured to sense the memory cell currents. The sense circuit 550 comprises a number of sense amplifiers, in one embodiment. A sense amplifier may be used to sense a current in a bit line, in one embodiment. In some embodiments, a number of memory cells are connected to the same bit line. Depending on how voltages are applied to the memory cells by the read or multiply circuit, the current from one or more memory cells may flow in the bit line. Thus, a sense amplifier may be used to sense the memory cell current from a single memory cell, or the combined memory cell current from multiple memory cells connected to the same bit line. The sense amplifier may also be configured to compare the magnitude of the bit line current to the magnitude of a reference current.

Figure 5C:
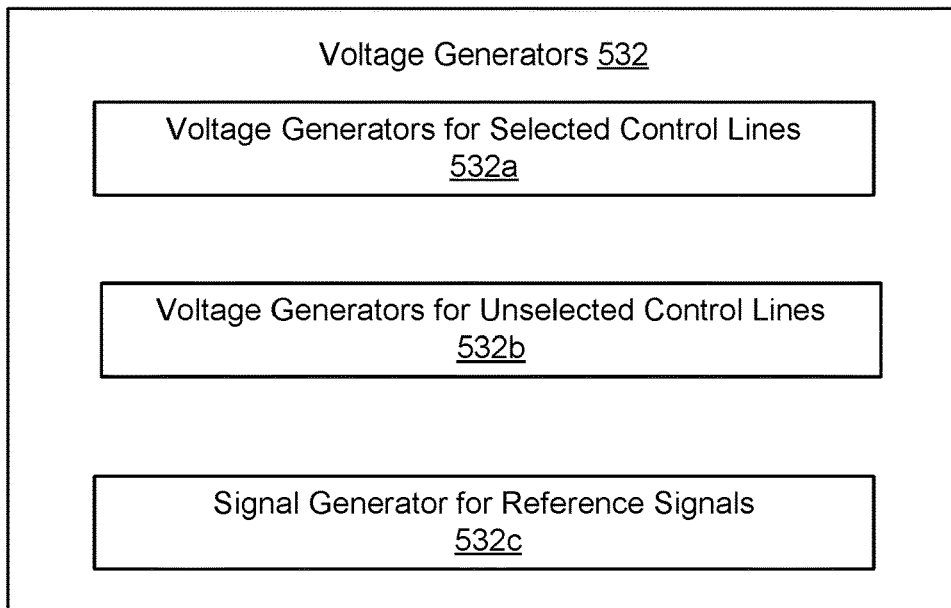
FIG. 5C depicts further details of one embodiment of voltage generators.

FIG. 5C depicts further details of one embodiment of voltage generators 532. The voltage generators include voltage generators for selected control lines 532a, voltage generators for unselected control lines 532b, and signal generators for reference signals 532c. Control lines may include bit lines, source lines and word lines, or a combination of bit lines, source lines and word lines. Voltage generators for selected control lines 532a may be used to generate program, read, and/or multiply voltages. In one embodiment, the voltage generators for selected control lines 532a generate a voltage whose magnitude is based on a multiplier for a mathematical multiplication operation. In one embodiment, the voltage difference between the voltages for two selected control lines is a multiply voltage.

Voltage generators for unselected control lines 532b may be used to generate voltages for control lines that a connected to memory cells that are not selected for a program, read, or multiply operation. The signal generators for reference signals 532c may be used to generate reference signals (e.g., currents, voltages) to be used as a comparison signal to determine the physical state of a memory cell.

For purposes of this document, the phrase "one or more control circuits" refers to a memory controller 102, a state machine, a micro-controller and/or memory structure control circuits 504, or other analogous circuits that are used to control non-volatile memory.

Figure 6:
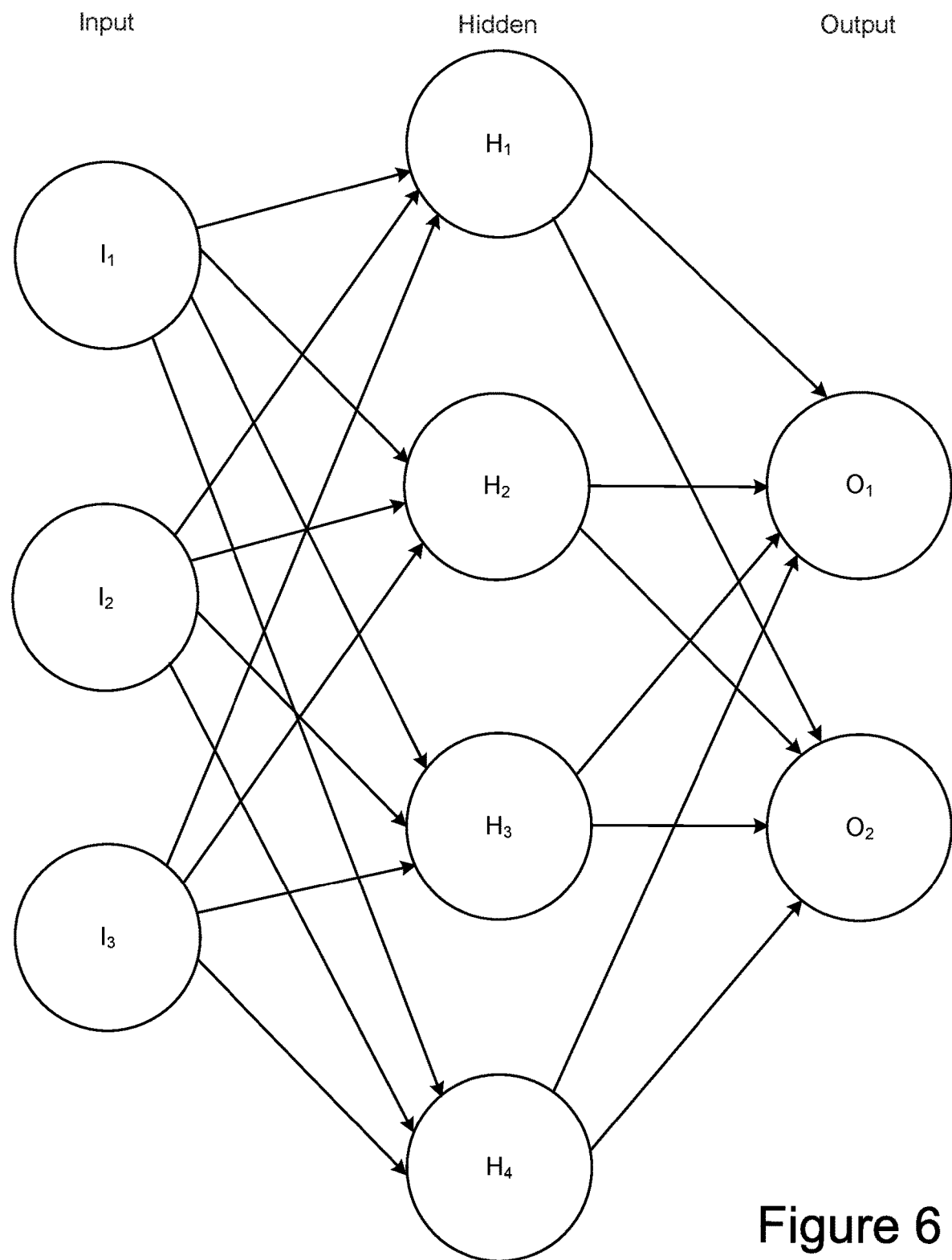
FIG. 6 illustrates a simple example of an artificial neural network.

Turning now to types of data that can be stored on non-volatile memory devices, a particular example of the type of data of interest in the following discussion is the weights used is in deep neural networks. An artificial neural network is formed of one or more intermediate layers between an input layer and an output layer. The neural network finds a mathematical manipulation to turn the input into the output, moving through the layers calculating the probability of each output. FIG. 6 illustrates a simple example of an artificial neural network.

In FIG. 6 an artificial neural network is represented as an interconnected group of nodes or artificial neurons, represented by the circles, and a set of connections from the output of one artificial neuron to the input of another. The example shows three input nodes ($I_1$, $I_2$, $I_3$) and two output nodes ($O_1$, $O_2$), with an intermediate layer of four hidden or intermediate nodes ($H_1$, $H_2$, $H_3$, $H_4$). The nodes, or artificial neurons/synapses, of the artificial neural network are implemented by logic elements of a host or other processing system as a mathematical function that receives one or more inputs and sums them to produce an output. Usually each input is separately weighted and the sum is passed through the node's mathematical function to provide the node's output.

In common artificial neural network implementations, the signal at a connection between nodes (artificial neurons/synapses) is a real number, and the output of each artificial neuron is computed by some non-linear function of the sum of its inputs. Nodes and their connections typically have a weight that adjusts as a learning process proceeds. The weight increases or decreases the strength of the signal at a connection. Nodes may have a threshold such that the signal is only sent if the aggregate signal crosses that threshold. Typically, the nodes are aggregated into layers. Different layers may perform different kinds of transformations on their inputs. Signals travel from the first layer (the input layer), to the last layer (the output layer), possibly after traversing the layers multiple times. Although FIG. 6 shows only a single intermediate or hidden layer, a complex deep neural network (DNN) can have many such intermediate layers.

An artificial neural network is "trained" by supplying inputs and then checking and correcting the outputs. For example, a neural network that is trained to recognize dog breeds will process a set of images and calculate the probability that the dog in an image is a certain breed. A user can review the results and select which probabilities the network should display (above a certain threshold, etc.) and return the proposed label. Each mathematical manipulation as such is considered a layer, and complex neural networks have many layers. Due to the depth provided by a large number of intermediate or hidden layers, neural networks can model complex non-linear relationships as they are trained.

Figure 7B:
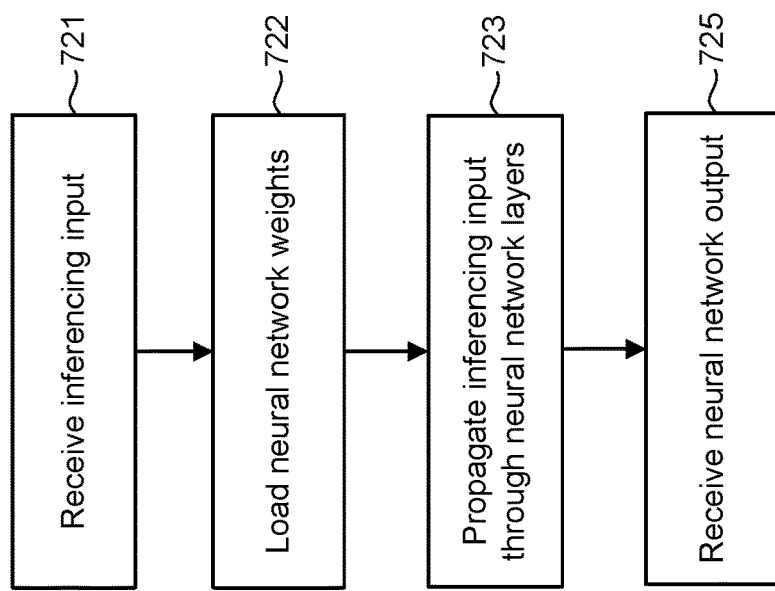
FIG. 7B is a flowchart describing one embodiment of a process for inference using a neural network.
Figure 7A:
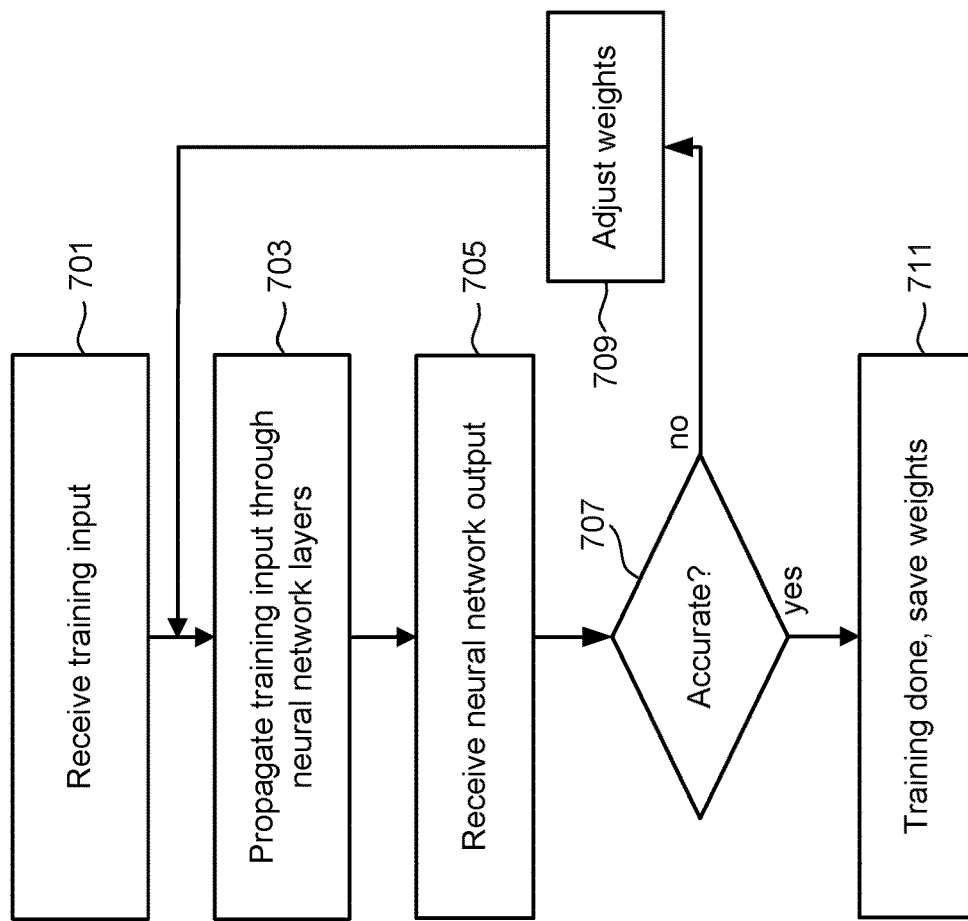
FIG. 7A is a flowchart describing one embodiment of a process for training a neural network to generate a set of weights.

FIG. 7A is a flowchart describing one embodiment of a process for training a neural network to generate a set of weights. The training process is often performed in the cloud, allowing additional or more powerful processing the accessed. At step 701, the input, such as a set of images, is received at the input nodes (e.g., $I_1$, $I_2$, $I_3$ in FIG. 6). At step 703 the input is propagated through the nodes of the hidden intermediate layers (e.g., $H_1$, $H_2$, $H_3$, $H_4$ in FIG. 6) using the current set of weights. The neural network's output is then received at the output nodes (e.g., $O_1$, $O_2$ in FIG. 6) in step 705. In the dog breed example of the preceding paragraph, the input would be the image data of a number of dogs, and the intermediate layers use the current weight values to calculate the probability that the dog in an image is a certain breed, with the proposed dog breed label returned at step 705. A user can then review the results at step 707 to select which probabilities the neural network should return and decide whether the current set of weights supply a sufficiently accurate labelling and, if so, the training is complete (step 711). If the result is not sufficiently accurate, the neural network adjusts the weights at step 709 based on the probabilities the user selected, followed by looping back to step 703 to run the input data again with the adjusted weights. Once the neural network's set of weights have been determined, they can be used to "inference," which is the process of using the determined weights to generate an output result from data input into the neural network. Once the weights are determined at step 711, they can then be stored in non-volatile memory for later use, where the storage of these weights in non-volatile memory is discussed in further detail below.

FIG. 7B is a flowchart describing a process for the inference phase of supervised learning using a neural network to predict the "meaning" of the input data using an estimated accuracy. Depending on the case, the neural network may be inferenced both at cloud and by an edge device's (e.g., smart phone, automobile process, hardware accelerator) processor. At step 721, the input is received, such as the image of a dog in the example used above. If the previously determined weights are not present in the device running the neural network application, they are loaded at step 722. For example, on a host processor executing the neural network, the weight could be read out of an SSD in which they are stored and loaded into RAM on the host device. At step 723, the input data is then propagated through the neural network's layers. Step 723 will be similar to step 703 of FIG. 7B, but now using the weights established at the end of the training process at step 711. After propagating the input through the intermediate layer, the output is then provided at step 725.

Neural networks are typically feedforward networks in which data flows from the input layer, through the intermediate layers, and to the output layer without looping back. At first, in the training phase of supervised learning as illustrated by FIG. 7A, the neural network creates a map of virtual neurons and assigns random numerical values, or "weights", to connections between them. The weights and inputs are multiplied and return an output between 0 and 1. If the network does not accurately recognize a particular pattern, an algorithm adjusts the weights. That way the algorithm can make certain parameters more influential (by increasing the corresponding weight) or less influential (by decreasing the weight) and adjust the weights accordingly until it determines a set of weights that provide a sufficiently correct mathematical manipulation to fully process the data.

Figure 8:
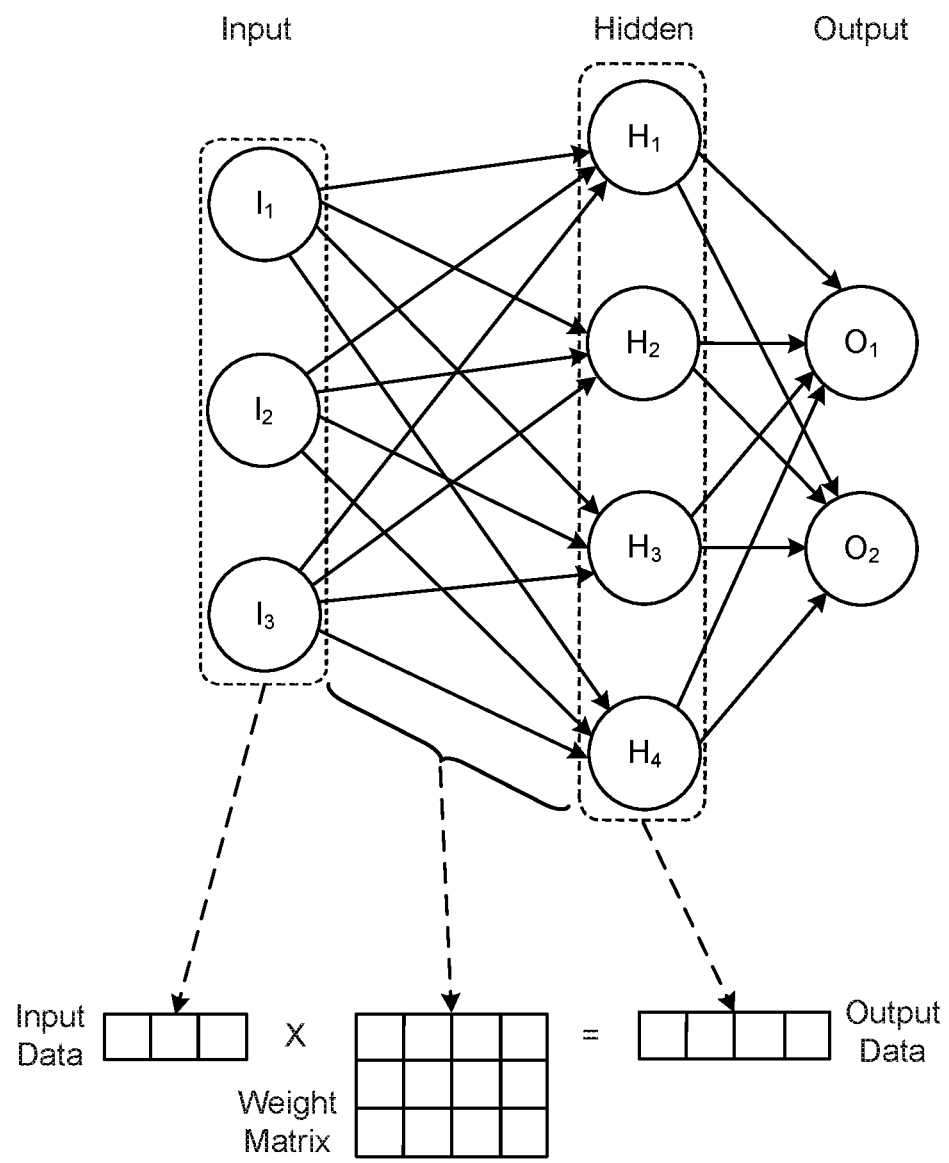
FIG. 8 is a schematic representation of the use of matrix multiplication in a neural network.

FIG. 8 is a schematic representation of the use of matrix multiplication in a neural network. Matrix multiplication, or MatMul, is a commonly used approach in both the training and inference phases for neural networks and is used in kernel methods for machine learning. FIG. 8 at top is similar to FIG. 6, where only a single hidden layer is shown between the input layer and the output layer. The input data is represented as a vector of a length corresponding to the number of input nodes. The weights are represented in a weight matrix, where the number of columns corresponds to the number of the number of intermediate nodes in the hidden layer and the number of rows corresponds to the number of input nodes. The output is determined by a matrix multiplication of the input vector and the weight matrix, where each element of the output vector is a dot product of the vector of the input data with a column of the weight matrix.

A common technique for executing the matrix multiplications is by use of a multiplier-accumulator (MAC, or MAC unit). However, this has a number of issues. Referring back to FIG. 7B, the inference phase loads the neural network weights at step 722 before the matrix multiplications are performed by the propagation at step 723. However, as the amount of data involved can be extremely large, use of a multiplier-accumulator for inferencing has several issues related to loading of weights. One of these is high energy dissipation due to having to use large MAC arrays with the required bit-width. Another is high energy dissipation due to the limited size of MAC arrays, resulting in high data movement between logic and memory and an energy dissipation that can be much higher than used in the logic computations themselves.

To help avoid these limitations, the use of a multiplier-accumulator array can be replaced with other memory technologies. For example, the matrix multiplication can be computed within a memory array by leveraging the characteristics of Storage Class Memory (SCM), such as those based on ReRAM, PCM, or MRAM based memory cells. This allows for the neural network inputs to be provided via read commands and the neural weights to be preloaded for inferencing. By use of in-memory computing, this can remove the need for logic to perform the matrix multiplication in the MAC array and the need to move data between the memory and the MAC array.

In some embodiments, the precision of the elements in the input vector is configurable. For example, the number of bits used for each element in the input vector could can be changed by changing how the memory structure 506 is operated. For example, the memory structure 506 may be operated such that at one time each element in the input vector is represented by a 2-bit value, at another time each element in the input vector is represented by a 4-bit value, and at still another time each element in the input vector is represented by an 8-bit value. Some neuromorphic computing techniques perform better with a higher resolution in the input vector, whereas other neuromorphic computing techniques do not require high resolution in the input vector. Embodiments of a memory system 100 are able to accommodate neuromorphic computing techniques that operate using different input vector resolutions. Moreover, in some embodiments, the voltage sources (e.g., DACs) that provide voltages that represent the elements in the input vector are themselves relatively low precision, which simplifies the design. In some embodiments, the memory structure 506 has 2-bit DACs, which may be operated to provide different resolutions for the elements of the input vector. For example, the 2-bit DACs may be operated to provide for 2-bit resolution, 4-bit resolution, 8-bit resolution, or some other resolution.

Figure 9:
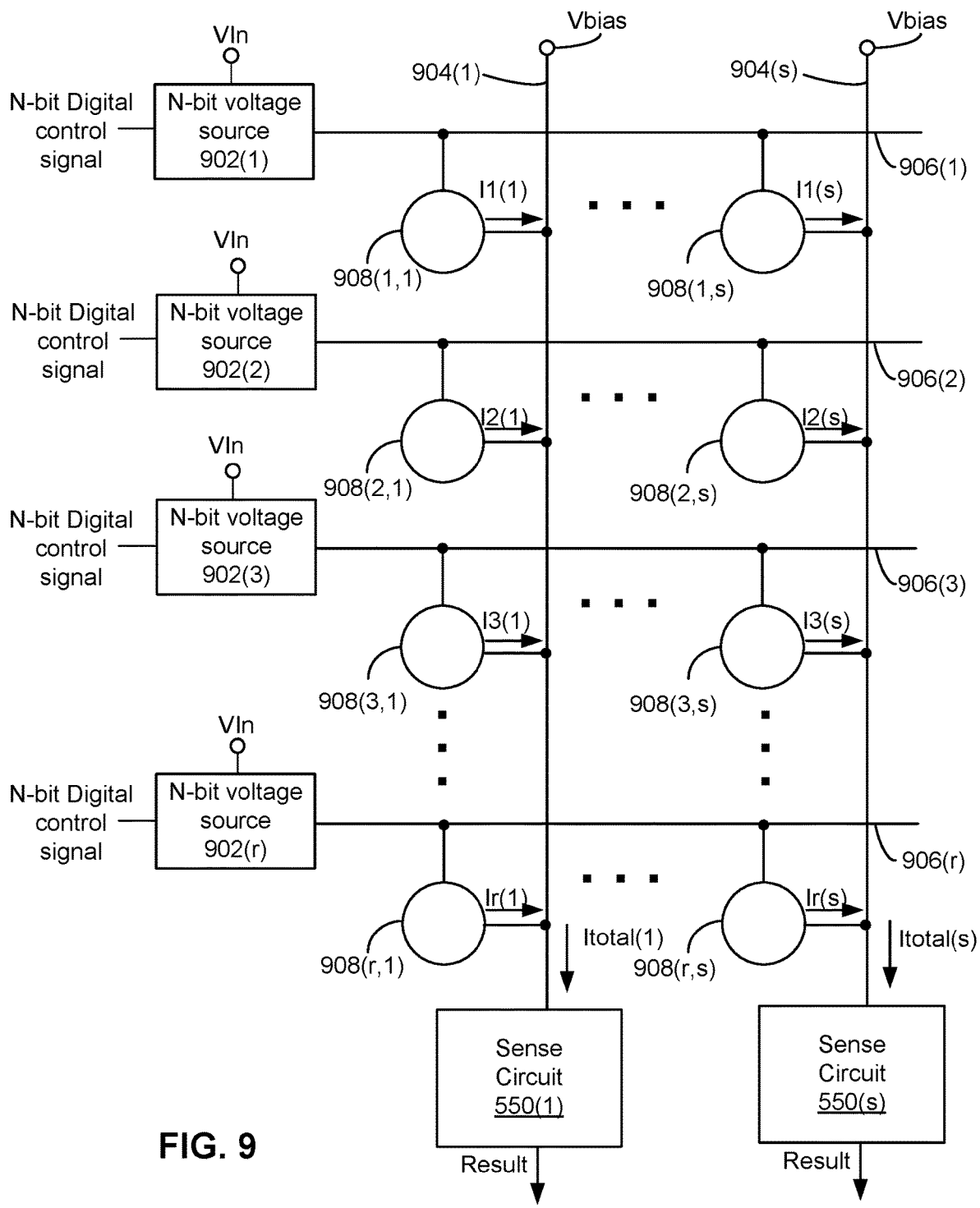
FIG. 9 is a diagram depicting one embodiment of an apparatus that may be used for in-memory computing.

FIG. 9 is a diagram depicting one embodiment of an apparatus 900 that may be used for in-memory computing. In one embodiment, the apparatus resides on a memory die 292. A number of memory cells 908 are depicted. In one embodiment, the memory cells 908 are in a cross point array. FIG. 9 depicts a portion of one embodiment of the cross point array. Each memory cell 908 is connected to a word line 906 and to a bit line 904. A word line could also be referred to as a row line. A bit line could also be referred to as a column line. Word lines 906(1), 906(2), 906(3), . . . 906(r) are depicted. Bit lines 904(1) . . . 904(s) are depicted.

FIG. 9 also depicts a number of n-bit voltage sources 902(1), 902(2), 902(3), . . . 902(r). An n-bit voltage source may be referred to more succinctly as a voltage source. Each voltage source 902 is connected to one of the word lines 906 in order to provide a voltage to that word line 906. Reference numeral 902 may be used to refer to a voltage source in general, without reference to a specific voltage source.

Each voltage source 902 inputs an n-bit digital control signal. The n-bit digital control signal contains n-bits of information. Note that n is an integer greater than zero. An n-bit digital control signal may be referred to more succinctly as a digital control signal or a control signal. The n-bit digital control signal may be provided by the memory structure control circuits 504. In one embodiment, a state machine in the memory structure control circuits 504 provides the n-bit digital control signal. A voltage source is referred to as an "n-bit" voltage source due to the number of bits in the control signal.

Each voltage source 902 inputs one or more input voltages. FIG. 9 shows a single input voltage (Vin), but there may be more than one input voltage per voltage source 902. In one embodiment, the voltage sources 902 are part of the voltage generators 532 (see FIG. 5B). In one embodiment, each voltage source 902 includes a digital-to-analog converter (DAC).

Each voltage source 902 outputs a voltage based on the n-bit digital control signal and the one or more input voltages. In one embodiment, each voltage source is configured to output $2^n$ unique output voltage magnitudes based on an n-bit digital control signal and the one or more voltages. In one embodiment, the digital control signal has two bits. In one embodiment, the n-bit voltage sources 902 are 2-bit voltage sources that are configured to output four unique output voltage magnitudes based on a 2-bit digital control signal and the one or more input voltages. However, the n-bit voltage sources 902 could be configured to operate with a digital control signal having more or fewer than two bits. Thus, the n-bit voltage sources 902 are not required to be 2-bit voltage sources. In one embodiment, the digital control signal has one bit. In one embodiment, the n-bit voltage sources 902 are one-bit voltage sources that are configured to output two unique output voltage magnitudes based on a one-bit digital control signal and the one or more input voltages. In one embodiment, the digital control signal has three bits. In one embodiment, the n-bit voltage sources 902 are three-bit voltage sources that are configured to output eight unique output voltage magnitudes based on a three-bit digital control signal and the one or more input voltages.

The number of bits in the n-bit digital control signal is referred to herein as the input resolution of the voltage source. In some embodiments, the voltage sources 902 are operated to reconfigure the input resolution. In one embodiment, the reconfiguration includes sending a 2n-bit digital control signal to a pair of the n-bit voltage sources 902. However, each individual voltage source 902 will treat the 2n-bit digital control signal as a separate n-bit digital control signal. For example, for a 2-bit input resolution, a 2-bit digital control signal may be sent to each 2-bit voltage source 902. For a 4-bit input resolution, a 4-bit digital control signal may be sent to each pair of 2-bit voltage sources 902. However, each individual voltage source 902 will treat the 4-bit digital control signal as a separate 2-bit digital control signal. The foregoing example may be extend by sending, for example a 4n-bit digital control signal to a set of four of the n-bit voltage sources 902. Further details of such a "parallel mode" of operation are discussed below in connection with FIGS. 10A-10D, 11 and 14.

In one embodiment, reconfiguring the input resolution involves operating each voltage source 902 over one or more cycles. For example, for an n-bit resolution, the voltage sources 902 are operated for one cycle. However, for a 2n-bit resolution, a 2n-bit bit digital control signal is split into two n-bit digital control signals, with each n-bit digital sent to a voltage source 902 each cycle. Further details of such a "serial mode" of operation are discussed below in connection with FIGS. 15, 16A, and 16B.

The number of unique output voltage magnitudes output by a single n-bit voltage source 902 is referred to herein as the output voltage resolution of the individual voltage source 902. In some embodiments, the voltage sources 902 are operated to collectively have an output voltage resolution of 2-bits. Further details of one embodiment having a collectively output voltage resolution of 2-bits are discussed below in connection with FIG. 10B. In some embodiments, the voltage sources 902 are operated to collectively have an output voltage resolution of 4-bits. Further details of one embodiment having a collective output voltage resolution of 4-bits are discussed below in connection with FIG. 10C. In some embodiments, the voltage sources 902 are operated to collectively have an output voltage resolution of 8-bits. Further details of one embodiment having an output voltage resolution of 8-bits are discussed below in connection with FIG. 10D.

In some embodiments, the number of cycles over which a voltage source 902 provides voltages is regulated in order to provide a target resolution. Herein, this is referred to as a serial mode. Further details of embodiments of a serial mode are discussed in connection with FIGS. 15, 16A, and 16B.

The apparatus 900 may be used to perform in-memory computing. In one embodiment, multiplication is performed. In one embodiment, vector/vector multiply is performed. In one embodiment, vector/matrix multiply is performed. In one embodiment, the in-memory computing is performed based on currents caused by the respective memory cells 908 in response to the voltages applied by the voltage sources 902, as well as voltages applied to the bit lines 904. The sense circuits 550(1) . . . 550(s) may be used to sense the memory cell currents. An example of vector/vector multiplication will be discussed with reference to the voltage sources 902 and the memory cells connected to bit line 904(1). The magnitude of the output voltage of each respective voltage source 902 may be used to represent one element of an input vector (such as the input data in FIG. 8). Each memory cell 908 connected to bit line 904(1) may be programmed to a state that represents an element in a second vector. In one embodiment, each memory cell 908 is programmed with one bit of information. For example, the memory cell 908 could be programmed to either a high resistance state or a low resistance state. In this example, each element in the second vector has a resolution of one-bit. However, the elements in the second vector could have a greater resolution. For example, FIG. 11 depicts an embodiment in which elements in the second vector have a 3-bit resolution. FIG. 11 will be discussed in greater detail below. Returning again to the discussed of FIG. 9, the current I1(1) that flows from memory cell 908(1,1) in response to the voltage from voltage source 902(1) represents multiplication of one element of the input vector and one element of the second vector. Similar reasoning applies to memory cells 908(2,1), 908(3,1), . . . 908(r,1). The currents I1(1), I2(1), I3(1) Ir(1) accumulate in the bit line 904(1) and a sensed by sense circuit 550(1) as Itotal(1). Therefore, the effect is a multiply and accumulate, or a vector/vector multiply. The sense circuit 550(1) outputs a result signal, which may be an analog signal or a digital signal the represents the vector/vector multiply.

Similar reasoning applies to the memory cells 908(1,s), 908(2,s), 908(3,s) . . . 908(r,s) connected to bit line 904(s). The results from each sense circuit 550(1) . . . 550(s) represent vector/matrix multiply. For example, the memory cells 908 may be programmed to represent a weight matrix (see FIG. 8), with the voltages from the voltage sources 902 representing the input vector.

Figure 10A:
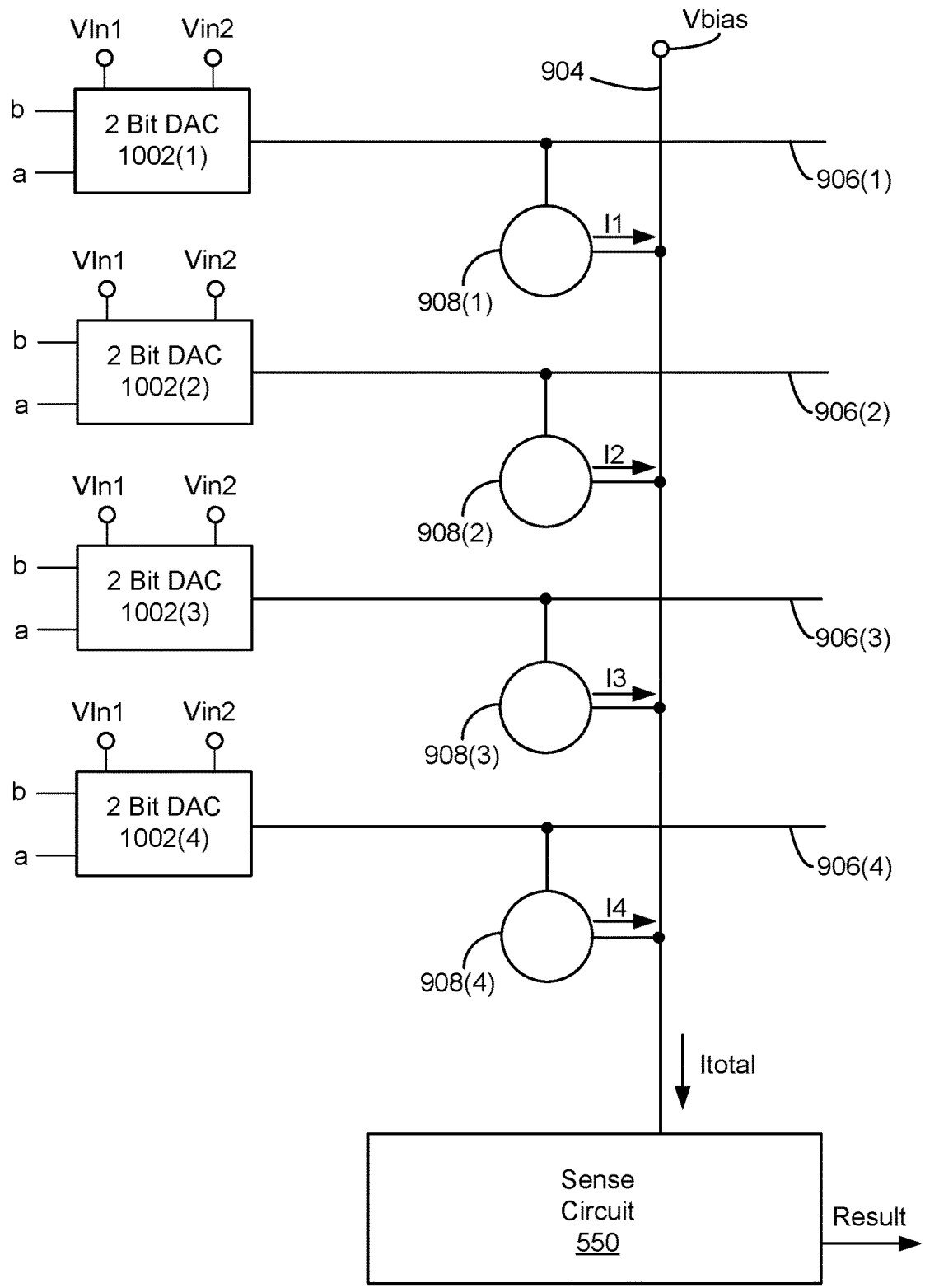
FIG. 10A depicts an embodiment of an apparatus in which the n-bit voltage sources of FIG. 9 are implemented with 2-bit digital DACs.

In one embodiment, the n-bit voltage sources 902 include 2-bit digital DACs. FIG. 10A depicts an embodiment of an apparatus 1000 in which the n-bit voltage sources 902 are implemented with 2-bit DACs 1002. FIG. 10A is similar to FIG. 9, but is simplified to facilitate discussion. Four 2-bit DACs 1002(1), 1002(2), 1002(3) and 1002(4) are depicted; however, there could be many more 2-bit DACs 1002. Only one bit line 904 is depicted in FIG. 10A, but there could be many more bit lines 904 in communication with the DACs 1002, similar to the configuration depicted in FIG. 9. Thus, while only four memory cells 908(1), 908(2), 908(3), and 908(4) are depicted in FIG. 10A, there may be many more rows and columns of memory cells.

Each 2-bit DAC 1002 is configured to input two bits of information (e.g., a, b). In one embodiment, each 2-bit DAC 1002 is configured to input two voltages (e.g., Vin1, Vin2). Each 2-bit DAC 1002 is configured to output a voltage having four unique magnitudes based on the two input bits and the input voltages. In another embodiment, a DAC 1002 may have a voltage divider or the like such that the voltage Vin2 may be derived from Vin1. Hence, in some embodiments, the 2-bit DACs 1002 only input one voltage.

Figure 10B:
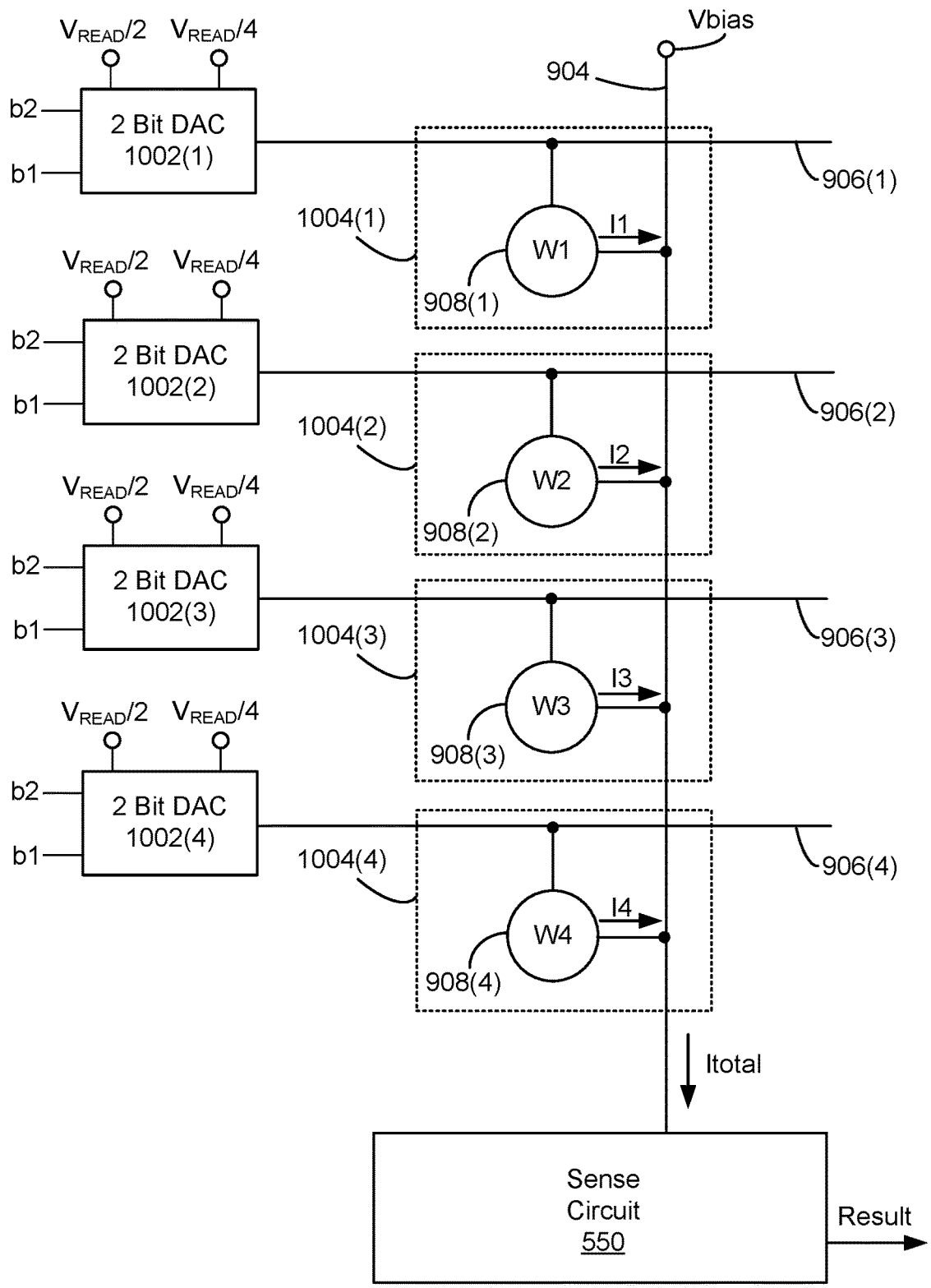
FIGS. 10B-10D depict how the apparatus of FIG. 10A may, in various embodiments, be reconfigured for different collective input resolution of the DACs.
Figure 10C:
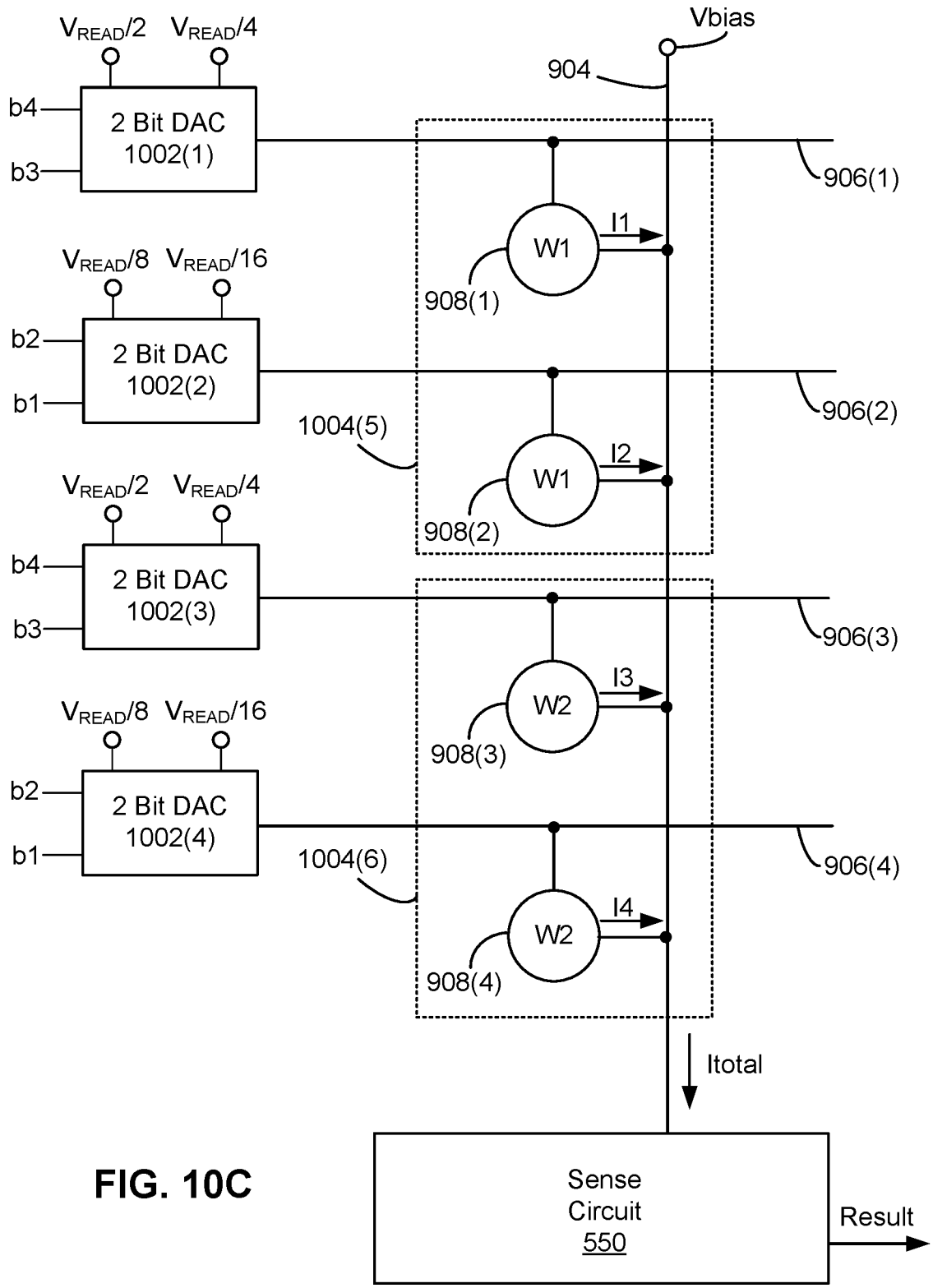
Figure 10D:
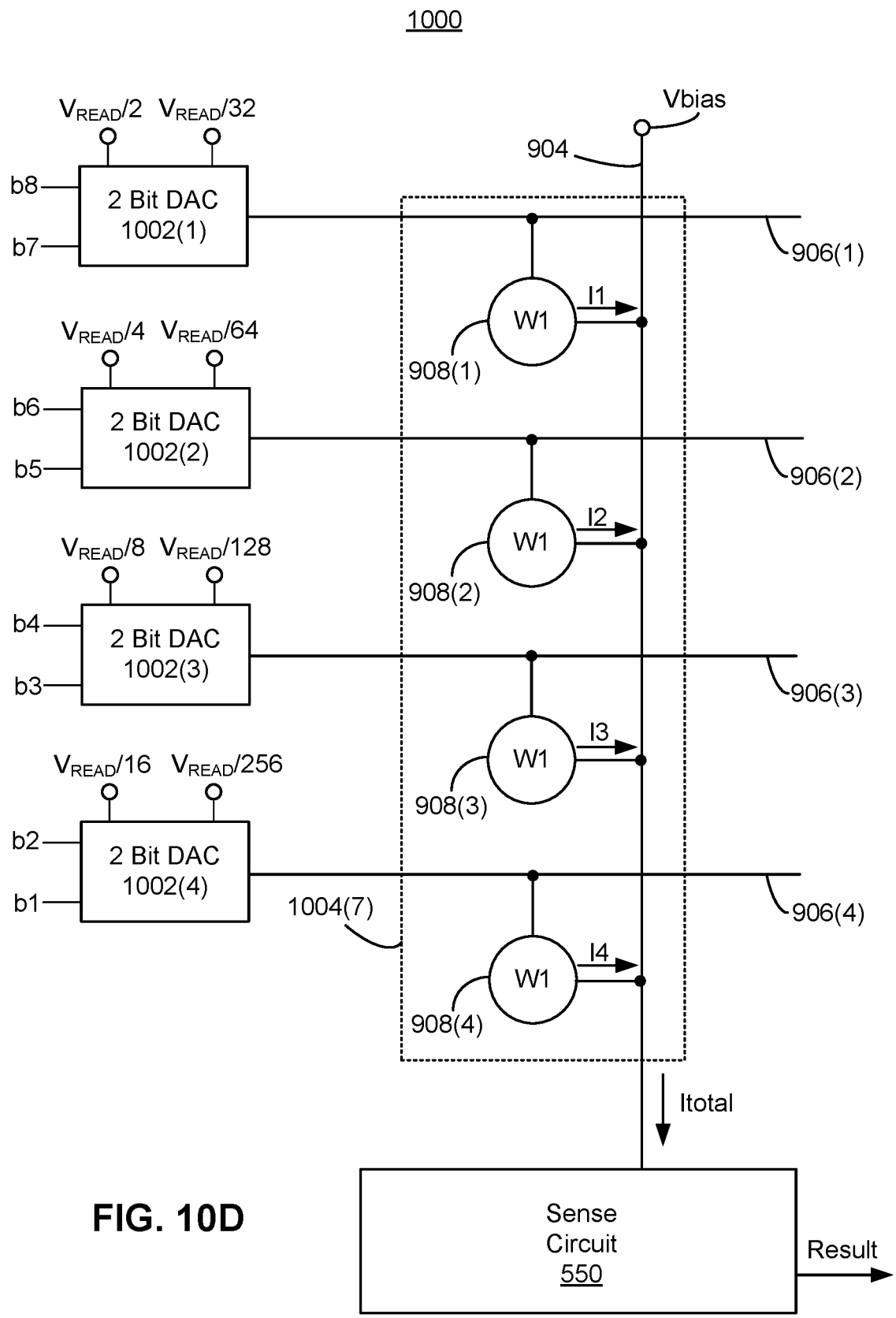

FIGS. 10B-10D will be used to show how the apparatus 1000 in FIG. 10A may be operated to reconfigure the input precision. FIGS. 10B-10D may be used to explain a parallel mode of operation of the apparatus 1000 of FIG. 10A to reconfigure the input precision. However, note that the apparatus of FIG. 10A may also be operated in a serial mode to reconfigure the input precision. In one embodiment, the input precision is the precision of each element in an input vector that is represented by output voltages of the 2-bit DACs 1002. In one embodiment, the input precision is the collective input resolution of the DACs 1002. For example, collectively the 2-bit DACs 1002 may have a 2-bit input resolution (see FIG. 10B), a 4-bit input resolution (see FIG. 10C), an 8-bit input resolution (see FIG. 10D), etc.

Stated another way, FIGS. 10B-10D will be used to show how the apparatus 1000 in FIG. 10A may be operated to reconfigure the collective output voltage resolution of the DACs 1002. For example, collectively the 2-bit DACs 1002 may have a 2-bit output voltage resolution (see FIG. 10B), a 4-bit output voltage resolution (see FIG. 10C), an 8-bit output voltage resolution (see FIG. 10D), etc.

FIG. 10B depicts how the apparatus 1000 of FIG. 10A may, in one embodiment, be configured for 2-bit collective input resolution of the DACs 1002. Stated another way, FIG. 10B depicts how the apparatus 1000 of FIG. 10A may, in one embodiment, be configured for 2-bit collective output voltage resolution of the DACs 1002.

In FIG. 10B, the memory cells are grouped into memory cell nodes 1004. For example, memory cell node 1004(1) contains memory cell 908(1), memory cell node 1004(2) contains memory cell 908(2), memory cell node 1004(3) contains memory cell 908(3), memory cell node 1004(4) contains memory cell 908(4). In this case, each memory cell node 1004 contains a single memory cell 908, but as will be discussed below memory cell nodes 1004 may contain more than one memory cell 908. A weight has been programmed into each memory cell node 908. The weight refers to a weight that may be used in a weight matrix, as discussed herein. The example of a weight is to facilitate discussion; however, the memory cells 908 are not required to contain a weight. In one embodiment, each memory cell 908 is programmed with one bit of information (e.g., high resistance state versus low resistance state) in order to represent the weight. In some embodiments, the weights are provided by the host 120.

Each 2-bit DAC 1002 inputs two bits (b1, b2). Each 2-bit DAC 1002(1) inputs two voltages (Vread/2, Vread/4). Each 2-bit DAC 1002(1) outputs four unique output voltages, based on the input bits and the input voltages. Table I shows one example of the mapping between the bits and the output voltages. However, other mappings may be used.

TABLE I

| b2 | b1 | Output Voltage |
|---|---|---|
| 0 | 0 | 0 V |
| 0 | 1 | Vread/4 V |
| 1 | 0 | Vread/2 V |
| 1 | 1 | 3 * Vread/4 V |

FIG. 10C depicts how the apparatus 1000 of FIG. 10A may, in one embodiment, be configured for 4-bit collective input resolution of the DACs 1002. Stated another way, FIG. 10C depicts how the apparatus 1000 of FIG. 10A may, in one embodiment, be configured for 4-bit collective output voltage resolution of the DACs 1002.

In FIG. 10C, each memory cell node 1004 contains two memory cells 908. For example, memory cell node 1004(5) contains memory cell 908(1) and memory cell 908(2). Likewise, memory cell node 1004(6) contains memory cell 908(3) and memory cell 908(4). A weight has been programmed into each memory cell node 1004. In this example, W1 is programmed into memory cell node 1004(5) and W2 is programmed into memory cell node 1004(6). Note that the same weight is programmed into each row of memory cells in a given memory cell node 1004. For example, W1 is programmed into both memory cell 908(1) and memory cell 908(2).

Each 2-bit DAC 1002 inputs two bits. However, the DACs are paired such that a pair of DACs collectively have a 4-bit input resolution. The 4-bit input resolution is indicated by b1, b2, b3, and b4 For example, 2-bit DAC 1002(2) inputs b1 and b2, whereas 2-bit DAC 1002(1) inputs b3 and b4. The foregoing allows 2-bit DAC 1002(1), 1002(2) to collectively operate with 4-bit input resolution. Note that the two DACs 1002(1), 1002(2) that are paired provide the voltages for memory node 1004(5). Likewise, DACs 1002(3), 1002(4) are paired to provide the voltages for memory node 1004(6). Herein, such pairing of DACs 1002 is an example of forming DAC nodes.

Each 2-bit DAC 1002 inputs two voltages. However, the voltages that are input to each DAC in a DAC pair are not the same. For example, 2-bit DAC 1002(1) inputs Vread/2 and Vread/4. Note that 2-bit DAC 1002(2) inputs Vread/8 and Vread/16. Each DAC pair (or DAC node) outputs sixteen unique output voltages, based on the input bits and the input voltages. FIG. 11 shows a table 1100 containing one embodiment of the mapping between the bits and the output voltages. However, other mappings may be used.

For the sake of discussion DAC 1002(2) in FIG. 10B will be used as an example of DAC A in table 1100 in FIG. 11. DAC 1002(1) in FIG. 10B will be used as an example of DAC B in table 1100 in FIG. 11. Table 1100 shows that each DAC A, DAC B outputs four unique voltage magnitudes. However, collectively DAC A and DAC B output sixteen unique voltage magnitudes. Note that in FIG. 10B, DAC 1002(1) and DAC 1002(2) may provide their respective output voltages to memory cell node 1004(5). More particularly, DAC 1002(1) provides a voltage to memory cell 908(1) and DAC 1002(2) provides a voltage to memory cell 908(2). In one embodiment, the effect of DAC 1002(1) and DAC 1002(2) providing voltages to different memory cells in node 1004(5) is the equivalent to the collective voltage being provided to a single memory cell in the memory cell node.

To help illustrate, an example will be discussed in which the value of the four bits are 1010. In this case, the voltage from DAC 1002(2) is Vread/8 and the voltage from DAC 1002(1) is Vread/2. Table 1100 indicates that the collective voltage is 5*Vread/8. Under these conditions, with reference to FIG. 10B, 2-bit DAC 1002(2) applies Vread/8 to memory cell 908(2), thereby resulting in current I2. Under these conditions, 2-bit DAC 1002(1) applies Vread/2 to memory cell 908(1), thereby resulting in current I1. Currents I1 and I2 may add together and be sensed by sense circuit 550. The sum of currents I1 and I2 may be the equivalent of applying, for example, 5*Vread/8 to memory cell 908(1) with no voltage applied to memory cell 908(2). Note again, that memory cell 908(1) and 908(2) have the same weight. Stated another way, memory cell 908(1) and 908(2) are in the same physical state.

Thus, while individually DAC 1002(1) and DAC 1002(2) each have a 2-bit input resolution, collectively DAC 1002(1) and DAC 1002(2) have a 4-bit input resolution. Furthermore, while individually DAC 1002(1) and DAC 1002(2) each have a 2-bit output voltage resolution, collectively DAC 1002(1) and DAC 1002(2) have a 4-bit output voltage resolution.

FIG. 10D depicts how the apparatus 1000 of FIG. 10A may, in one embodiment, be configured for an 8-bit collective input resolution of the DACs 1002. Stated another way, FIG. 10D depicts how the apparatus 1000 of FIG. 10A may, in one embodiment, be configured for 8-bit collective output voltage resolution of the DACs 1002.

In FIG. 10D, each memory cell node 1004 contains four memory cells 908. For example, memory cell node 1004(7) contains memory cell 908(1), memory cell 908(2), memory cell 908(3), and memory cell 908(4). A weight (W1) has been programmed into each memory cell in the memory cell node 1004(7). Note that the same weight is programmed into each row of memory cells.

Each 2-bit DAC 1002 inputs two bits. However, the DACs are grouped into a set of four such that collectively the DACs 1002 have an 8-bit input resolution. The 8-bit input resolution is indicated by bits b1, b2, b3, b4, b5, b6, b7, and b8. For example, 2-bit DAC 1002(4) inputs b1 and b2, 2-bit DAC 1002(3) inputs b3 and b4, 2-bit DAC 1002(2) inputs b5 and b6, and 2-bit DAC 1002(1) inputs b7 and b8. Note that all four DACs 1002(1), 1002(2), 1002(3), and 1003(4) provide the voltages for memory node 1004(7). Herein, such a grouping of DACs 1002 is an example of a DAC node.

Each 2-bit DAC 1002 in FIG. 10D inputs two voltages. However, the voltages that are input to each of the DACs is not the same. For example, 2-bit DAC 1002(1) inputs Vread/2 and Vread/32, 2-bit DAC 1002(2) inputs Vread/4 and Vread/64, 2-bit DAC 1002(3) inputs Vread/8 and Vread/128, and 2-bit DAC 1002(4) inputs Vread/16 and Vread/256.

Collectively, the DACs 1002 output 128 unique output voltages, based on the input bits and the input voltages.

Thus, while individually 2-bit DAC 1002(1), 2-bit DAC 1002(2), 2-bit DAC 1002(3), and 2-bit DAC 1002(4) have a 2-bit input resolution, collectively two 2-bit DAC 1002(1), 2-bit DAC 1002(2), 2-bit DAC 1002(3), and 2-bit DAC 1002(4) have an 8-bit input resolution. Furthermore, while individually 2-bit DAC 1002(1), 2-bit DAC 1002(2), 2-bit DAC 1002(3), and 2-bit DAC 1002(4) have a 2-bit output voltage resolution, collectively 2-bit DAC 1002(1), 2-bit DAC 1002(2), 2-bit DAC 1002(3), and 2-bit DAC 1002(4) have an 8-bit output voltage resolution.

Note that other input voltages may be provided to the 2-bit DACs 1002, while still achieving the desired output voltage resolution. For example, the input voltage scheme in FIG. 10C may be modified such that Vread/2 and Vread/4 are provided to 2-bit DAC 1002(1), Vread/8 and Vread/16 are provided to 2-bit DAC 1002(2), Vread/32 and Vread/64 are provided to 2-bit DAC 1002(3), and Vread/128 and Vread/256 are provided to 2-bit DAC 1002(4) in an alternate to the voltage scheme depicted in FIG. 10D.

Figure 12:
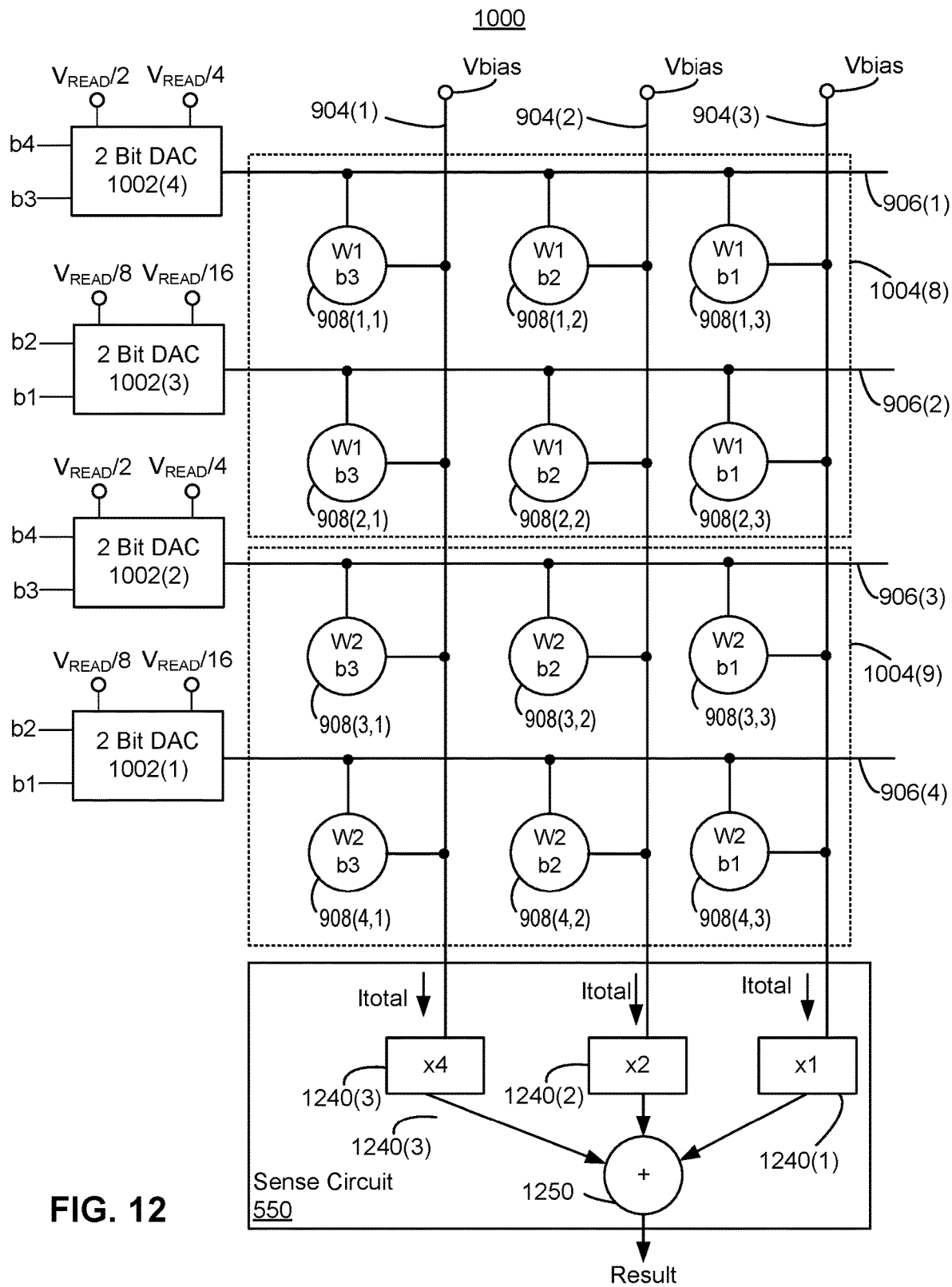
FIG. 12 depicts an embodiment in which the weights in the memory cells are represented by three bits.

As noted above, the weights in the memory cells can be represented by more than one bit. FIG. 12 depicts an embodiment in which the weights in the memory cells are represented by three bits. This example is similar to FIG. 10C in which there is a 4-bit input resolution. However, in FIG. 10C, the weights are represented by a single bit under the assumption that each memory cell 908 stores one bit (e.g., high resistance state versus low resistance state). Referring again to FIG. 12, two memory cell nodes 1004(8) and 1004(9) are depicted. Each memory cell node 1004 stores one weight, with the weight having three-bits. Memory cell node 1004(8) stores W1. Specifically, memory cell 908(1,3) stores bit b1 of weight W1, memory cell 908(1,2) stores bit b2 of weight W1, and memory cell 908(1,1) stores bit b3 of weight W1. The three-bit weight is also stored in the row connected to word line 906(2). For example, memory cell 908(2,3) stores bit b1 of weight W1, memory cell 908(2,2) stores bit b2 of weight W1, and memory cell 908(2,1) stores bit b3 of weight W1. In a similar manner, memory cell node 1004(9) stores W2. Specifically, memory cell 908(3,3) stores bit b1 of weight W2, memory cell 908(3,2) stores bit b2 of weight W2, and memory cell 908(3,1) stores bit b3 of weight W2. The three-bit weight is also stored in the row connected to word line 906(4). For example, memory cell 908(4,3) stores bit b1 of weight W2, memory cell 908(4,2) stores bit b2 of weight W2, and memory cell 908(4,1) stores bit b3 of weight W2.

Figure 19:
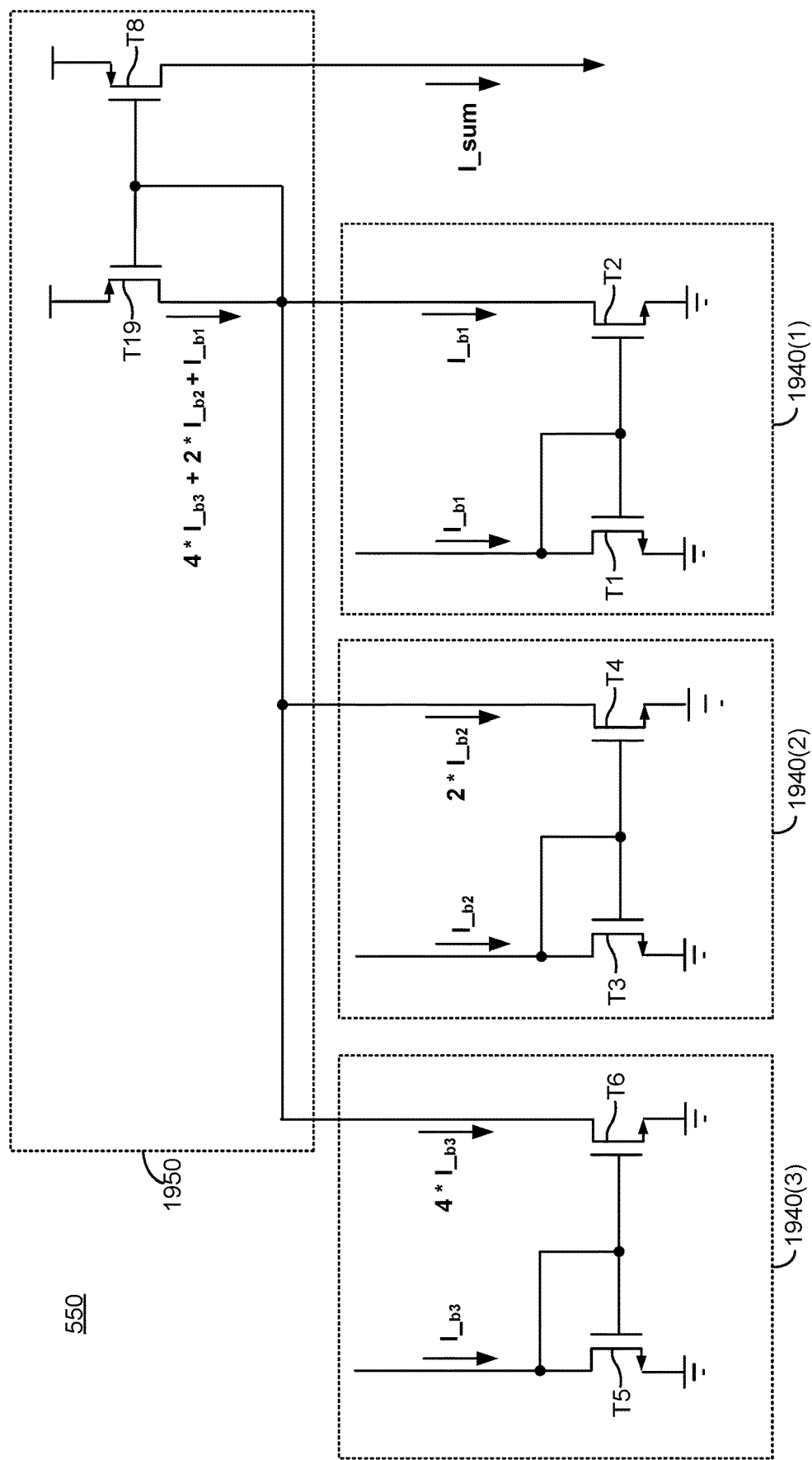
FIG. 19 is a schematic diagram of one embodiment of a portion of a sense circuit that may be used to provide for multi-bit weights.

The sense circuit 550 multiplies the current in the three bit lines 904(1), 904(2) and 904(3) by different factors. The current from bit line 904(3) is multiplied by 1 by multiplier 1240(1), which realizes the "ones" position in the three-bit weight. The current from bit line 904(2) is multiplied by 2 by multiplier 1240(2), which realizes the "twos" position in the three-bit weight. The current from bit line 904(1) is multiplied by 4 by multiplier 1240(3), which realizes the "fours" position in the three-bit weight. The three bit line currents are then summed by summer 1250, after the aforementioned multiplication of the bit line currents. The result may be an analog or digital value. FIG. 19 depicts a circuit schematic for one embodiment that may be used in the sense circuit 550 of FIG. 12. FIG. 19 will be discussed in more detail below.

As noted above, different application may benefit from different input resolutions. For example, some applications may operate well with a low resolution of an input vector in a neuromorphic computing system. Other applications may operate better with a higher resolution of the input vector. Embodiments of a memory system are able to re-configure the input resolution for in-memory computing. In one embodiment, the input resolution is the resolution of elements of the input vector. In one embodiment, the input resolution is re-configured by re-configuring the collective input resolution of voltage sources 902. For example, the collective input resolution may be changed from a 2-bit resolution to a 4-bit resolution. In one embodiment, the voltage sources 902 are implemented using DACs 1002. In some embodiments, a higher input resolution corresponds to a higher output voltage resolution. Embodiments of a memory system to re-configure the collective output voltage resolution of voltage sources 902 (e.g., DACs 1002) in order to re-configure the input resolution.

Figure 13:
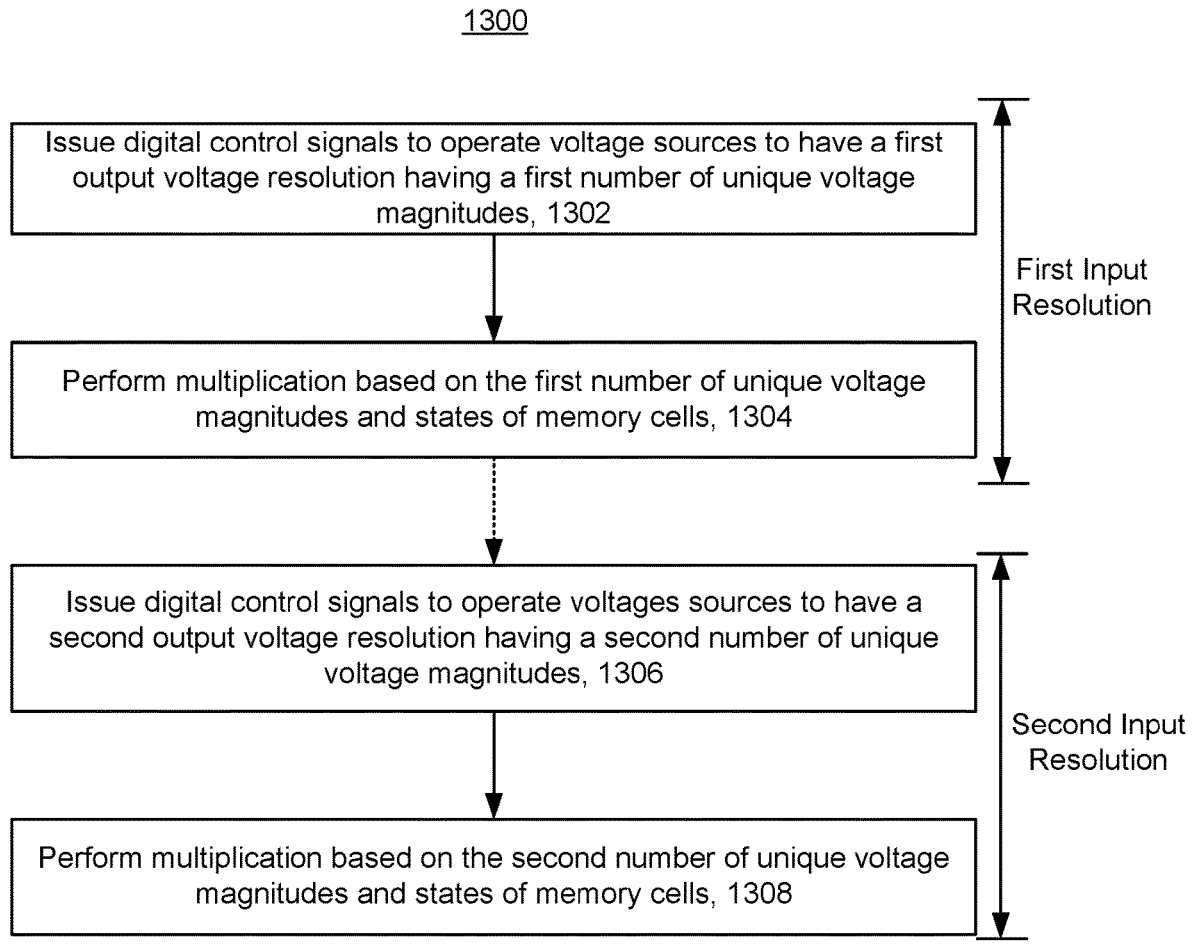
FIG. 13 is a flowchart of one embodiment of a process of re-configuring input resolution for in-memory computing.

FIG. 13 is a flowchart of one embodiment of a process 1300 of re-configuring input resolution for in-memory computing. The input resolution may refer to the resolution or precision of input data upon which in-memory computing is performed. For example, the input resolution may be the resolution of each element of an input vector. For example, each element could be represented by one bit, two bits, three bits, etc. The input resolution may be impacted by the resolution of voltage sources 902. In some embodiments, reconfiguring the input resolution of the voltage sources 902 is used to provide for different precision in the input data. In some embodiments, reconfiguring the output voltage resolution of the voltage sources 902 is used to provide for different precision in the input data.

In some embodiments, the process 1300 is used to perform vector/matrix multiplication. For example, the process 1300 could be used to compute the output data depicted in FIG. 8. The process 1300 may be used to change the precision of the input data in FIG. 8, as one example. For example, process 1300 may be used to select how many bits are used to represent each element in the input data of FIG. 8. In one embodiment, the process 1300 is performed by memory system 100.

Steps 1302-1304 represent operating with a first input resolution. Step 1302 includes issuing digital control signals to operate voltage sources 902 to have a first output voltage resolution. The first output voltage resolution has a first number of unique voltage magnitudes. In one embodiment, each voltage source 902 is configured to input an n-bit digital control signal and one or more input voltages. Furthermore, each voltage source may be configured to output $2^n$ unique output voltage magnitudes based on the n-bit digital control signal and the one or more input voltages. For example, each voltage source 902 may be a 2-bit DAC that is configured to output four unique output voltage magnitudes. Thus, each voltage source 902 may be a relatively low resolution DAC, or the like. Therefore, the complexity of the design is simplified relative to using higher resolution voltage sources.

Figure 14:
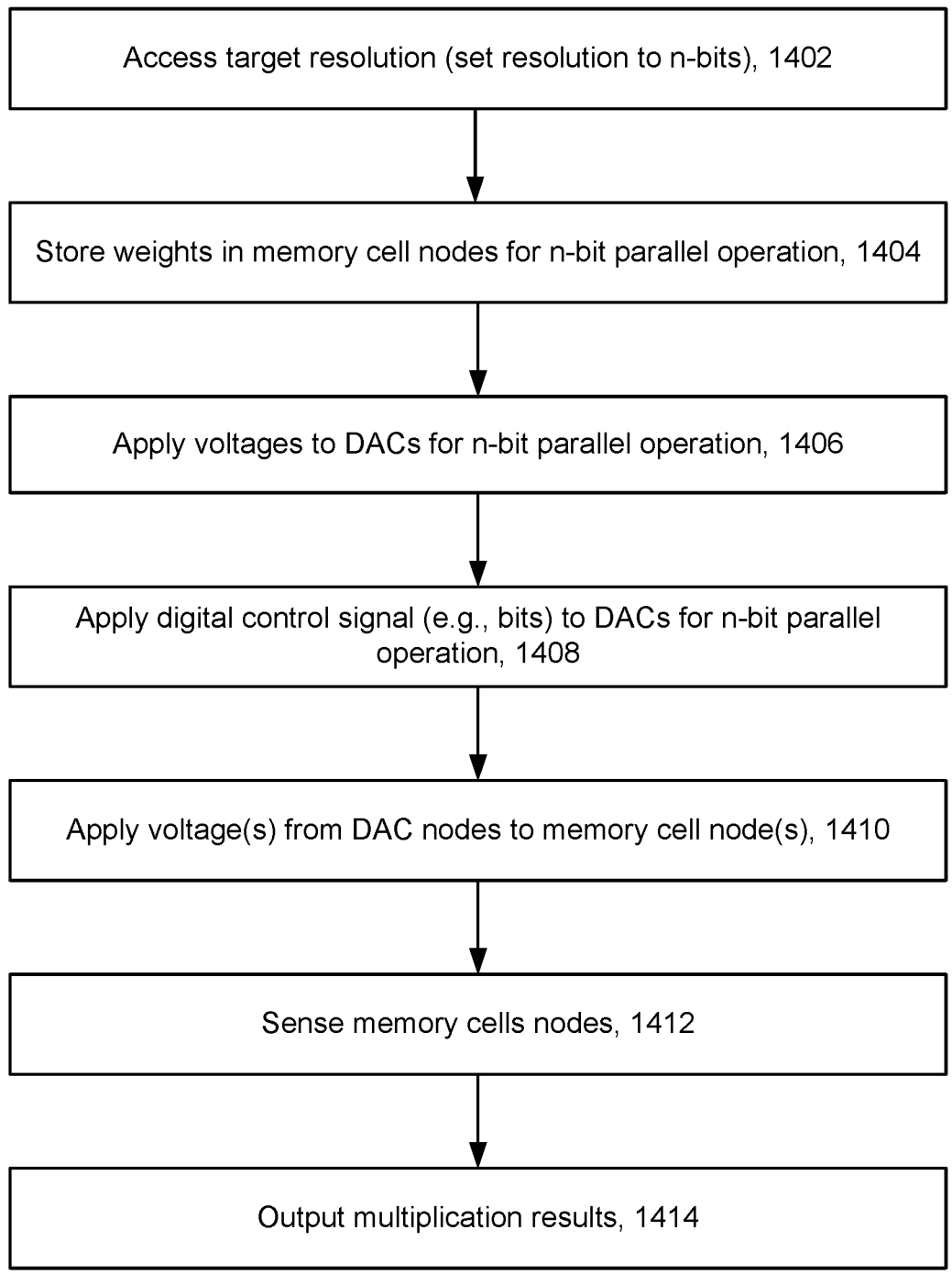
FIG. 14 depicts a flowchart of one embodiment of a process of parallel mode operation for in-memory computing.

Several examples operating at a first output voltage resolution have been discussed in connection with FIGS. 10B, 10C, and 10D. Each of these examples may be referred to as a parallel mode of operation. FIG. 14, to be discussed below, depicts a flowchart that provides further details for one embodiment of a parallel mode of operation.

Figure 15:
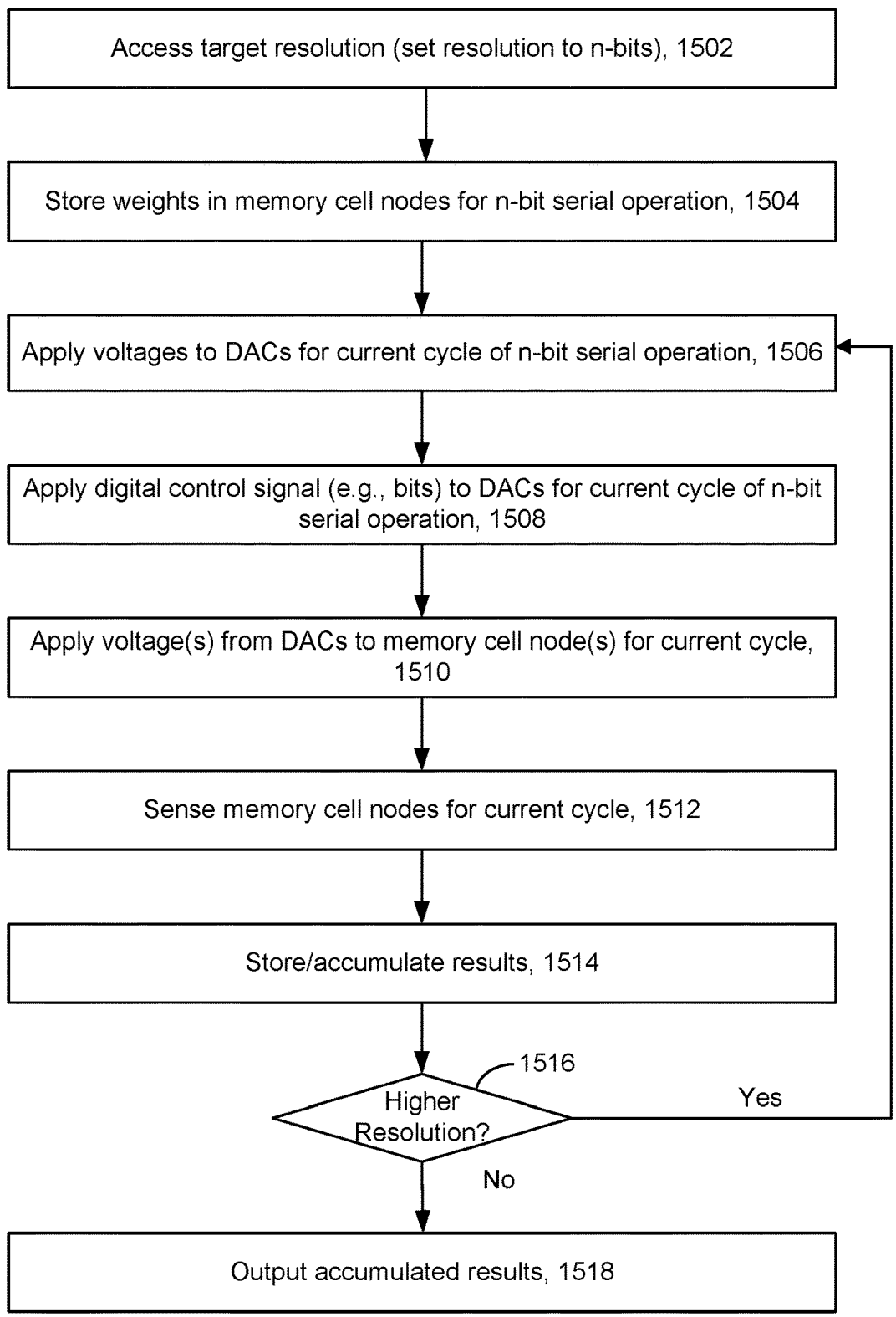
FIG. 15 depicts a flowchart of one embodiment of a process of serial mode of operation for in-memory computing.

In some embodiments, the voltage sources 902 are operated in a serial mode of operation to achieve different output voltage resolutions. Briefly, a serial mode includes operating the voltages sources 902 over one or more cycles, with a different number of cycles used to achieve a different output voltage resolution. FIG. 15, to be discussed below, depicts a flowchart that provides further details of one embodiment of a serial mode of operation. Note that the apparatus of FIG. 10A may be used for both the parallel mode and the serial mode.

Step 1304 includes performing multiplication based on the first number of unique voltage magnitudes and states of memory cells 908. The multiplication in step 1304 (as well as step 1308 below) may include, but is not limited to, scalar multiplication, vector/vector multiplication (also referred to as vector dot product or multiply and accumulate), vector/matrix multiplication. It is not required that multiplication at each memory cell node 1004 use all of the unique voltage magnitudes. In one embodiment, the memory cells 908 reside in a cross-point array, such as depicted in any of FIG. 9 or 10A-10D. The multiplication may be performed as has been discussed in connection with FIG. 9 or 10A-10D. FIGS. 14 and 15 provide further details for embodiments of performing multiplication based on the voltage magnitudes and states of memory cells 908.

A dashed line appears between steps 1304 and 1306 to represent the change of configuration of input resolution. In one embodiment, this change is initiated at the request of the host 120. Steps 1306-1308 represent operating with a second input resolution that is different from the first input resolution. Step 1306 includes issuing digital control signals to operate voltage sources 902 to have a second output voltage resolution. The second output voltage resolution has a second number of unique voltage magnitudes that is different from the first number of unique voltage magnitudes. For example, operation may be changed from that of FIG. 10B to 10C, from 10B to 10D, from 10C to 10D, etc.

In at least one of step 1302 or step 1306 the voltage sources are operated at an output voltage resolution that is higher than an individual output voltage resolution of the individual voltage sources 902. For example, if the individual voltage sources 902 each output four unique voltage magnitudes, then in at least one of step 1302 or step 1306, the voltage sources 902 output more than four unique voltage magnitudes. Note that this allows relatively low resolution voltage sources to be used. For example, the voltage sources 902 may be 2-bit DACs (outputting four unique voltage magnitudes), wherein in at least one of step 1302 or step 1306 the DACs operate as 4-bit DAC nodes (outputting sixteen unique voltage magnitudes).

The following describes some differences between step 1302 and 1306, in accordance with one embodiment. In step 1302, m of the n-bit voltage sources 902 are provided an n-bit digital control signal to cause the m voltage sources 902 to output $m*(2^n)$ unique output voltage magnitudes to achieve the first output voltage resolution. In step 1306 p*m of the voltage sources 902 are each provided an n-bit digital control signal to cause the p*m voltage sources to output $p*m*(2^n)$ unique output voltage magnitudes to achieve the second output voltage resolution. In this example, m is an integer greater than zero, and p is an integer greater than one. For example, in FIG. 10B, DAC 1002(1) is provided a 2-bit control signal to cause DAC 1002(1) to output four unique control signals to memory cell node 1004(1). In FIG. 10C, DAC 1002(1) and DAC 1002(2) are each provided a 2-bit control signal to cause DAC 1002(1) and DAC 1002(2) to output sixteen unique control signals to memory cell node 1004(5). In the example of FIG. 10B, DAC 1002(1) may be referred to as a DAC node (or voltage source node) that provides voltages for memory cell node 1004(1). In the example of FIG. 10C, DAC 1002(1) and DAC 1002(2) may be referred to as a DAC node (or voltage source node) that provides voltages for memory cell node 1004(5).

Step 1308 includes performing multiplication based on the first number of unique voltage magnitudes and states of memory cells 908. In one embodiment, the memory cells 908 reside in a cross-point array, such as depicted in any of FIG. 9 or 10A-10D. The multiplication may be performed as has been discussed in connection with FIG. 9 or 10A-10D. FIGS. 14 and 15 provide further details for embodiments of performing multiplication based on the voltage magnitudes and states of memory cells 908.

The following describes some differences between step 1304 and 1308, in accordance with one embodiment. In step 1304 the multiplication is performed based on applying the first number of unique output voltage magnitudes to first memory cell nodes 1004 having a first number of memory cells 908. In step 1308 the multiplication is performed the multiplication based on applying the second number of unique output voltage magnitudes to second memory cell nodes 1004 having a second number of the memory cells 908. The second number of the memory cells is different from the first number of the memory cells. For example, the memory cells nodes 1004 in FIGS. 10B, 10C, and 10D have different numbers of memory cells 908 relative to the other figures.

As noted above, in some embodiments, the voltage sources 902 (e.g., DACs 1002) are operated in a parallel mode. FIG. 14 depicts a flowchart of one embodiment of a process 1400 of parallel mode operation for in-memory computing. The process 1400 provides further details for one embodiment of process 1300. Step 1402 includes accessing a target resolution. In one embodiment, the target resolution is the target bit resolution for a DAC node. Recall that a DAC node refers to a grouping or one or more DACs. The resolution is set to n-bit resolution, where n represents the target bit resolution. For example, the target resolution could be 2-bit resolution for a DAC node, 4-bit resolution for a DAC node, 8-bit resolution for a DAC node, etc. In step 1402, the resolution is set to n-bit resolution, which in process 1400 will refer to the resolution of a DAC node.

Step 1404 includes storing weights into memory cell nodes 1004 for n-bit parallel operation. In one embodiment, the weights are weights in a weight matrix (see, for example, FIG. 8). Each memory cell node 1004 contains one or more memory cells 908. In one embodiment, a memory cell node 1004 is connected to one or more word lines 906 and to one or more bit lines 904. For example, in FIG. 10B each memory cell node 1004 is connected to one word line 906 and one bit line 904, in FIG. 10C each memory cell node 1004 is connected to two word lines 906 and one bit line 904, in FIG. 10D each memory cell node 1004 is connected to four word lines 906 and one bit line 904, in FIG. 11 each memory cell node 1004 is connected to two word lines and three bit lines 904. In one embodiment, the number of word lines 906 to which a memory cell node is connected is selected based on the target voltage resolution. For example, in FIGS. 10B, 10C, and 10D, each memory cell node 1004 is connected to a different number or word lines.

In one embodiment, the number of bit lines 904 to which a memory cell node 1004 is connected corresponds to the number of bits in the weight. For example, in FIGS. 10B-10D, each weight has one bit. However, in FIG. 11, each weight has three bits. In some embodiments, the same weight is stored into each row in the memory cell node 1004. Stated another way, the same weight is stored in a memory cell node 1004 for each word line 906 to which the memory cell node 1004 is connected. For example, in FIG. 10D, the same weight (W1) is stored in the four word lines 906(1)-906(4) to which memory cell node 1004(7) is connected.

Step 1406 includes providing voltages and bits to DACs 1002 for n-bit parallel operation. For example, with reference to FIG. 10A, voltages Vin1 and Vin2 are provided to the 2-bit DAC 1002. Examples of such voltages are depicted in FIGS. 10B-10D, but step 1406 is not limited thereto. Also with reference to FIG. 10A, bit a and bit b are provided to each 2-bit DAC 1002. Examples of such bits are depicted in FIGS. 10B-10D, but step 1406 is not limited thereto.

Step 1408 includes applying a digital control signal (e.g., bits) to the DACs 1002 for n-bit parallel operation. Examples of applying a digital control signal to the DACs for n-bit parallel operation has been shown and described with respect to FIGS. 10B-10D. In one embodiment, the n-bit parallel operation provides greater resolution than an individual voltage resolution of the DACs 1002. For example, the individual voltage resolution of a DAC 1002 may be two bits (e.g., four unique voltage magnitudes). However, in step 1408, the n-bit parallel operation provides, in one embodiment, provide for greater than two bits resolution (e.g., greater than four unique voltage magnitudes). Process 1400 allows relatively low precision DACs 1002 to be used to provide different target voltage resolutions.

Step 1410 includes applying voltage(s) from DAC nodes to memory cell nodes 1004. As can be seen in, for example, FIG. 10C, the output of 2-bit DAC 1002(1) is connected to word line 906(1) to provide its output voltage to memory cell node 1004(5). Likewise, the output of 2-bit DAC 1002(2) is connected to word line 906(2) to provide its output voltage to memory cell node 1004(5). Thus, a DAC node that includes 2-bit DAC 1002(1) and 2-bit DAC 1002(2) provides voltages to memory cell node 1004(5).

Step 1412 includes sensing the memory cell nodes 1004 in response to the applied voltage. Sense circuit 550 may be used to sense a bit line current. Step 1412 may include sensing one or more bit lines for the memory cell nodes 1004. As will be appreciated from the discussion above, the currents from individual memory cell nodes 1004 that are connected to the same bit line may be combined in the bit line 904. As will be appreciated from the discussion above, a memory cell node 1004 may be connected to more than one bit line. In some embodiments, currents from multiple bit lines 904 may be combined (see, for example, FIG. 12).

Step 1414 includes providing a multiplication result based on sensing the memory cell nodes 1004. In one embodiment, the result is for multiplication of an input vector by a weight matrix. The voltages that are output by the DACs 1002 may be used to represent elements of the input vector. Hence, process 1400 allows the precision of the elements of the input vector to be selected based on the target voltage resolution.

As noted above, in some embodiments, the voltage sources 902 (e.g., DACs 1002) are operated in a serial mode. FIG. 15 depicts a flowchart of one embodiment of a process 1500 of serial mode operation for in-memory computing. The process 1500 provides further details for one embodiment of process 1300. The same DACs 1002 that are depicted in FIG. 10A may be used in the serial mode. Thus, the same DACs 1002 may be used for both the parallel and the serial mode. To facilitate explanation of process 1500, FIGS. 16A and 16B will be referred to.

Step 1502 includes accessing a target resolution. The target resolution may be expressed in a number of ways. One way of expressing the target resolution is the resolution of input data. For example, the target resolution may be the target resolution of each element of an input vector. For example, each element could be represented by one bit, two bits, three bits, etc. Another way of expressing the target resolution is the resolution of DACs 1002 over a number of cycles. Note that the resolution in the serial mode refers to the resolution of a DAC 1002 over the number of cycles performed in the serial mode. Another way of expressing the target resolution is the number of unique output voltages from a DAC over the cycles in a serial mode. Stated another ways, this is the number of unique output voltages that may be applied to a memory cell node 1004 over the cycles in a serial mode. In step 1502, the resolution is set to n-bit resolution, which in process 1500 will refer to the resolution of a DAC over the cycles in the serial mode.

Step 1504 includes storing weights into memory cell nodes 1004 for n-bit serial operation. For example, with respect to FIG. 16A, the weight W1 is stored in memory node 1004(1), W2 is stored in memory node 1004(2), W3 is stored in memory node 1004(3), and W4 is stored in memory node 1004(4).

Step 1506 includes applying voltages to DACs 1002 for the current cycle of n-bit serial operation. With respect to FIG. 16A, the voltages Vread/2 and Vread/4 are applied to each of the DACs 1002.

Step 1508 includes applying a digital control signal to each DAC 1002 for the current cycle of n-bit serial operation. With respect to FIG. 16A, the digital control signal has bits b3 and b4 in this cycle. This is because there will be 4-bit resolution in this example. Note that it is not required to start with the most significant bits. In one embodiment, the least significant bits are applied in the first cycle.

Figure 16A:
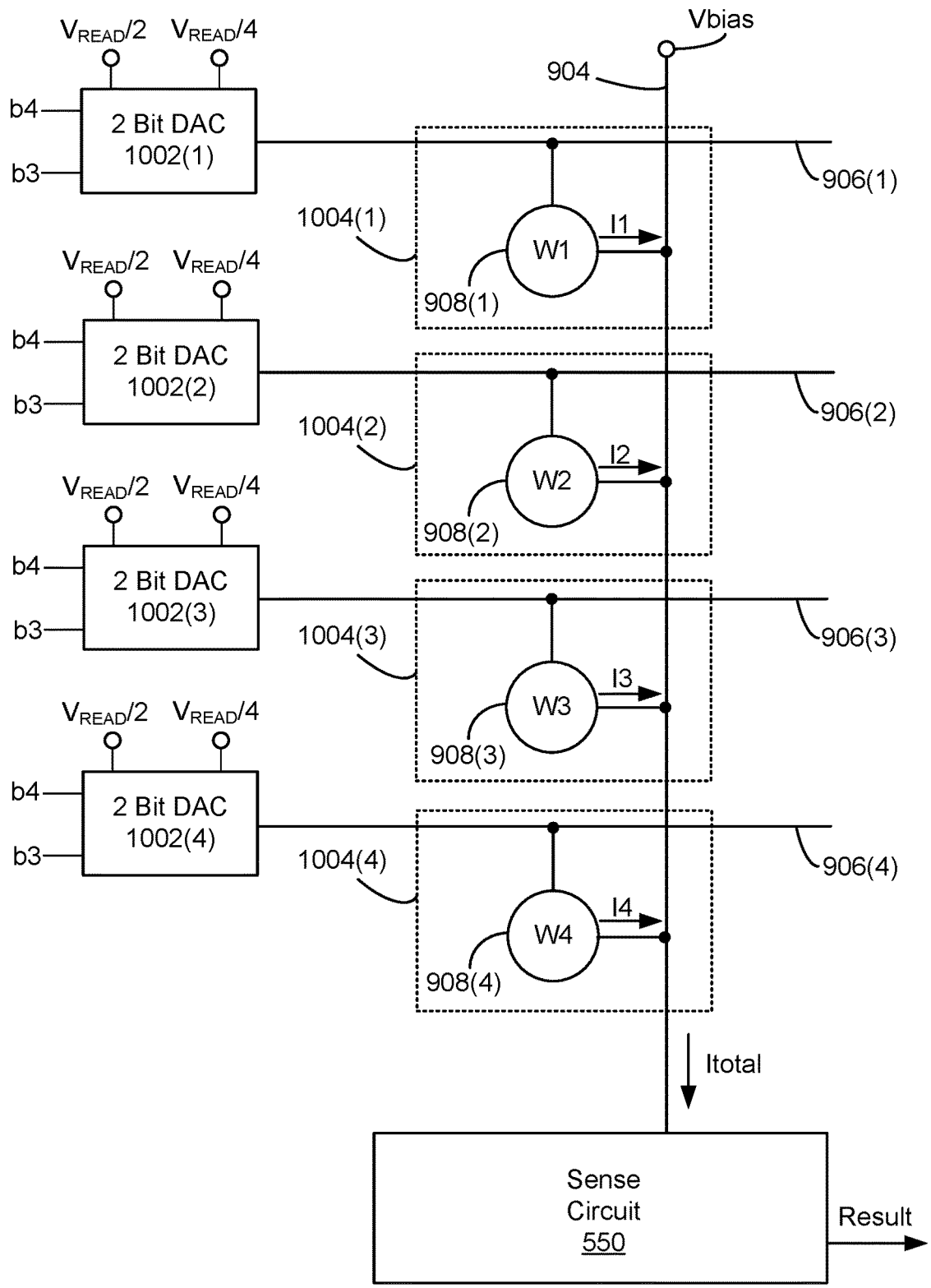
FIGS. 16A and 16B depict how the apparatus of FIG. 10A may be used in an embodiment of the serial mode of operation for in-memory computing.

Step 1510 includes applying the voltages from the DACs 1002 to the memory cell nodes 1004. As can be seen in FIG. 16A, the outputs of the DACs 1002 are connected to the respective memory cell nodes 1004 via the word lines 906 in order to apply the voltages to the memory cell nodes 1004.

Step 1512 includes sensing memory cell nodes 1004 for the current cycle. Sense circuit 550 may be used to sense one or more bit line currents.

Step 1514 includes storing and/or accumulating the results. Accumulating the results is used for later cycles, in which results from each cycle are accumulated. The storing of the results can be performed in the analog domain or the digital domain. For example, in the analog domain, a bit line current might be used to charge a charge storage device such as a capacitor. In the digital domain, a bit line current may be converted to a digital value by, for example, an analog to digital converter.

Figure 16B:
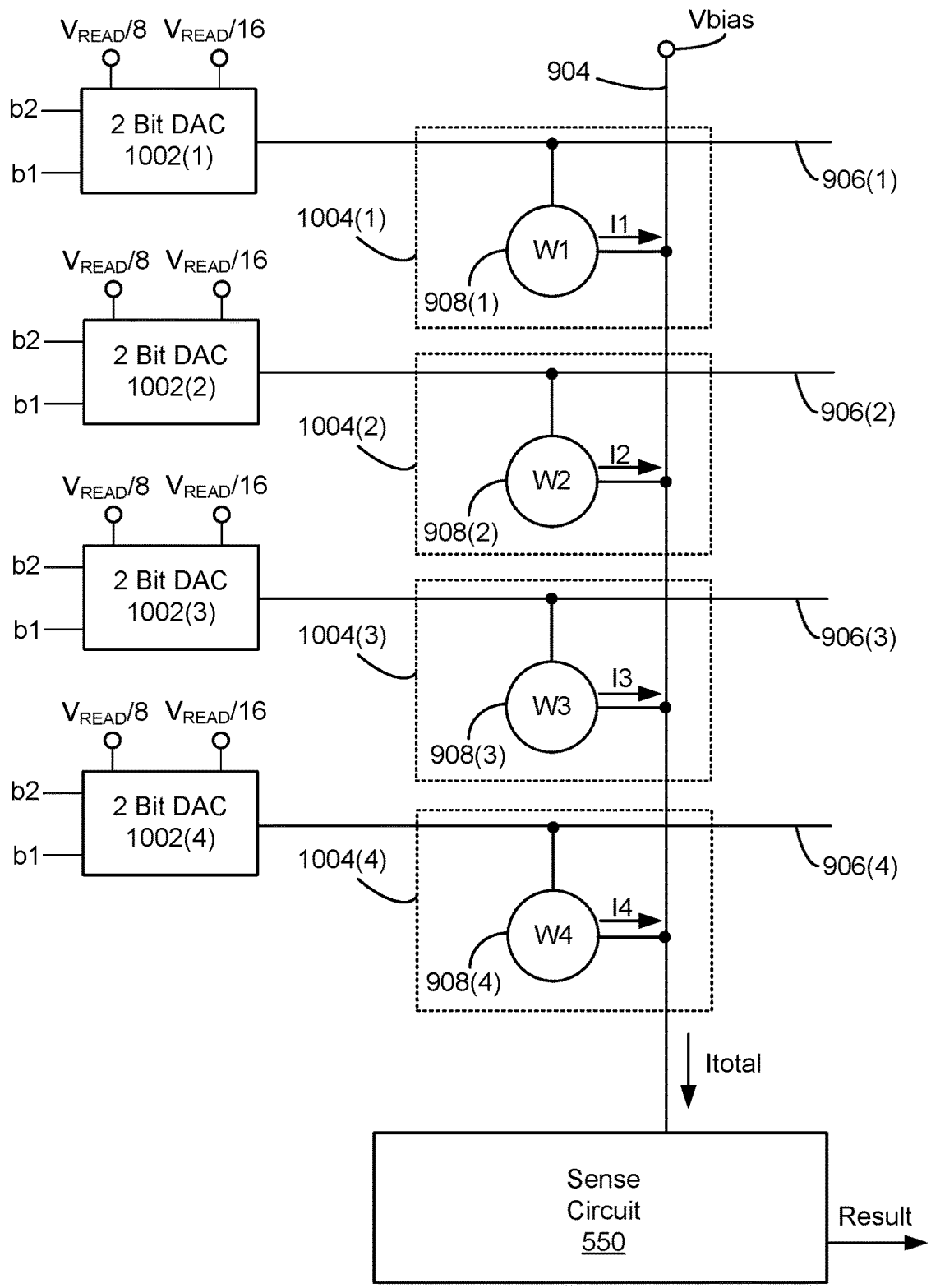

Step 1516 is a determination of whether a higher resolution is to be provided. If so, control passes to step 1506. In the example presently being discussed, a higher resolution is to be provided. Thus, in step 1506 a new set of voltages are applied to the DACs 1002 for the second cycle. FIG. 16B depicts voltages for one embodiment of a second cycle. In FIG. 16, Vread/8 and V/read/16 are provided to each DAC 1002. Note that the net effect is that the same voltages are provided to each DACs 1002 over two cycles, as were provided in the 4-bit resolution example of FIG. 10C to two DACs at the same time. Thus, the voltages in FIGS. 16A and 16B provide a similar result for an embodiment of the serial mode that the voltages in FIG. 10C provide for an embodiment of the parallel mode.

Step 1508 includes applying a digital control signal to the DACs 1002, which in this case is for the second cycle. With reference to FIG. 16B, the digital control signal includes the least significant bits b1 and b2. Steps 1510-1512 are to applying the voltages and sense the memory cell nodes 1004, as described above.

Step 1514 is to store/accumulate the results. In the second (or any additional) cycles, the results are accumulated with all prior cycles. This accumulation could be performed in the analog domain or the digital domain. For example, additional charge could be added to a charge storage device. Alternatively, the bit line current could be converted to digital value and added to the stored digital value from all prior cycles.

The resolution can be made even higher by performing additional cycles, as determined by step 1516. Note that the resolution in the present example (4-bit resolution) is greater than the individual resolution of the DACs 1002. Thus, relatively low precision DACs 1002 may be used to provide reconfigurable resolution.

Step 1518 is to output the accumulated results. Similar to other examples discussed herein, the results could be vector/vector multiplication, vector/matrix multiplication, but are not limited thereto.

As noted above, the resolution can be configured based on the number of cycles in which the DACs 1002 are used to provide voltages. In one embodiment, process 1500 is run for m cycles to cause each voltage source 902 to output m*(2^n) unique output voltage magnitudes to achieve a first output voltage resolution. In each of the m cycles an n-bit digital control signal is provided to each voltage source 902. In one embodiment, a different set of one or more voltages are provided to each voltage source 902 for each of the m cycles to cause each voltage source to output the m*(2^n) unique output voltage magnitudes. In the examples in this paragraph, m and n are integers greater than zero.

In one embodiment, process 1500 is run for p*m cycles to cause each voltage source to output p*m*(2^n) unique output voltage magnitudes to achieve a second output voltage resolution. In each of the p*m cycles an n-bit digital control signal is provided to each voltage source 902. In one embodiment, a different set of one or more voltages are provided to each voltage source 902 for each of the p*m cycles to cause each voltage source 902 to output the p*m*(2^n) unique output voltage magnitudes. In the examples in this paragraph, m and n are integers greater than zero, and p is an integer greater than one.

Figure 17:
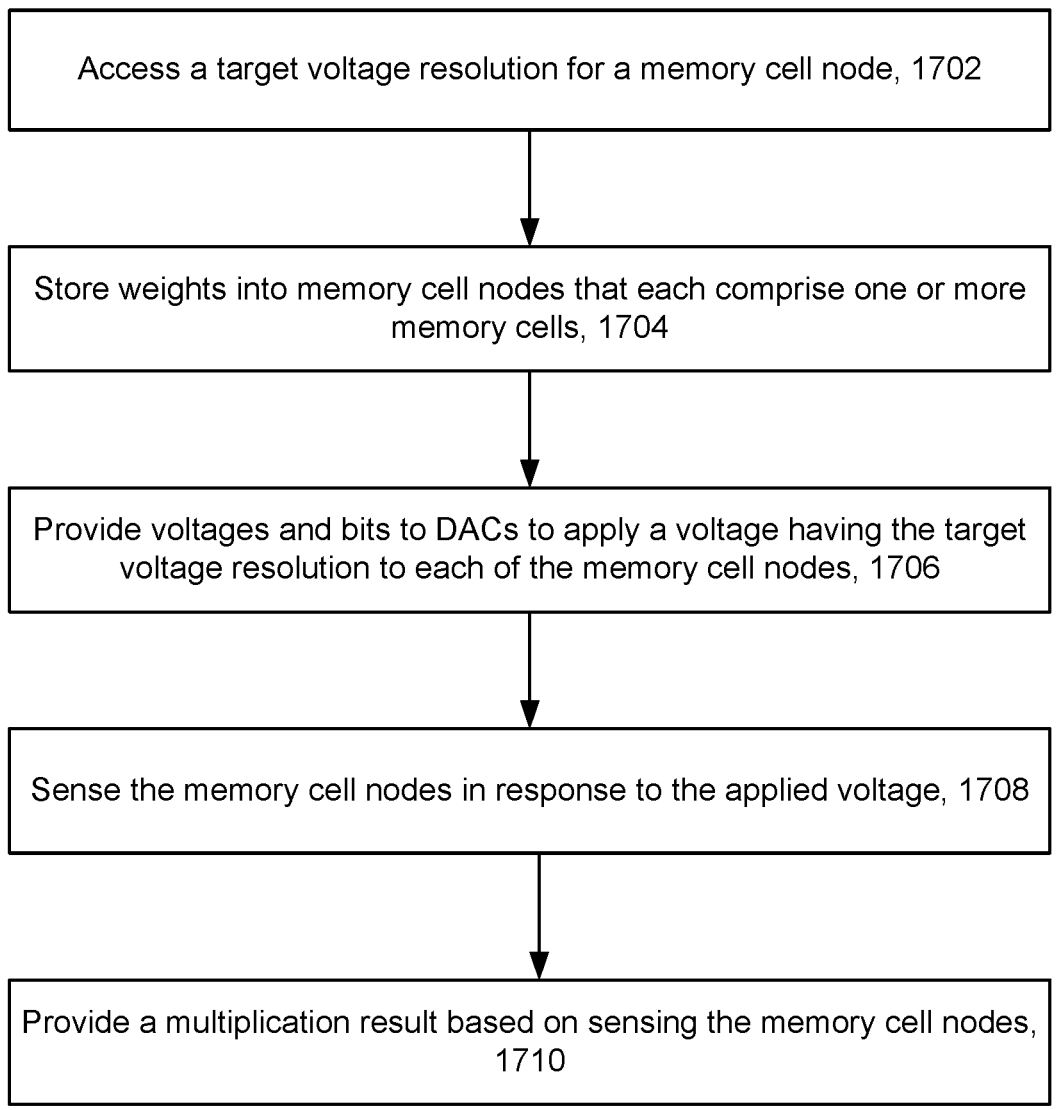
FIG. 17 depicts a flowchart of a process that may use either the parallel mode or the serial mode of operation for in-memory computing.

FIG. 17 depicts a flowchart of one embodiment of a process 1700 that may use either the parallel mode or the serial mode to perform in-memory multiplication. Hence, process 1700 may be a generalization of process 1400 or process 1500. Process 1700 is one embodiment of process 1300. Step 1702 includes accessing a target voltage resolution for a memory cell node 1004. The target voltage resolution for a memory cell node 1004 refers to the number of unique voltage magnitudes that may be applied to a memory cell node 1004. The target voltage resolution for a memory cell node 1004 may be related to the input data resolution. For example, each unique voltage magnitude may be used to represent a different value in an element in an input vector. For example, each element in the input vector may be expressed with 2-bits of resolution, three-bits of resolution, 4-bits of resolution, etc.

Step 1704 includes storing weights in the memory cell nodes for n-bit parallel operation. One embodiment of step 1704 is to perform step 1404 in the parallel mode. One embodiment of step 1704 is to perform step 1504 in the serial mode.

Step 1706 includes providing voltages and bits to the DACs 1002 in order to apply a voltage having the target voltage resolution to each memory cell node 1004. In one embodiment, step 1706 includes performing steps 1406-1410 in the parallel mode. In one embodiment, step 1706 includes performing steps 1506-1510 in the serial mode.

Step 1708 includes sensing the memory cell nodes 1004. In one embodiment, step 1708 includes performing step 1412 in the parallel mode. In one embodiment, step 1708 includes performing steps 1512-1514 in the serial mode.

Step 1710 includes providing a multiplication result based on sensing the memory cell nodes 1004. In one embodiment, step 1710 includes performing step 1414 in the parallel mode. In one embodiment, step 1710 includes performing step 1518 in the serial mode.

Figure 18:
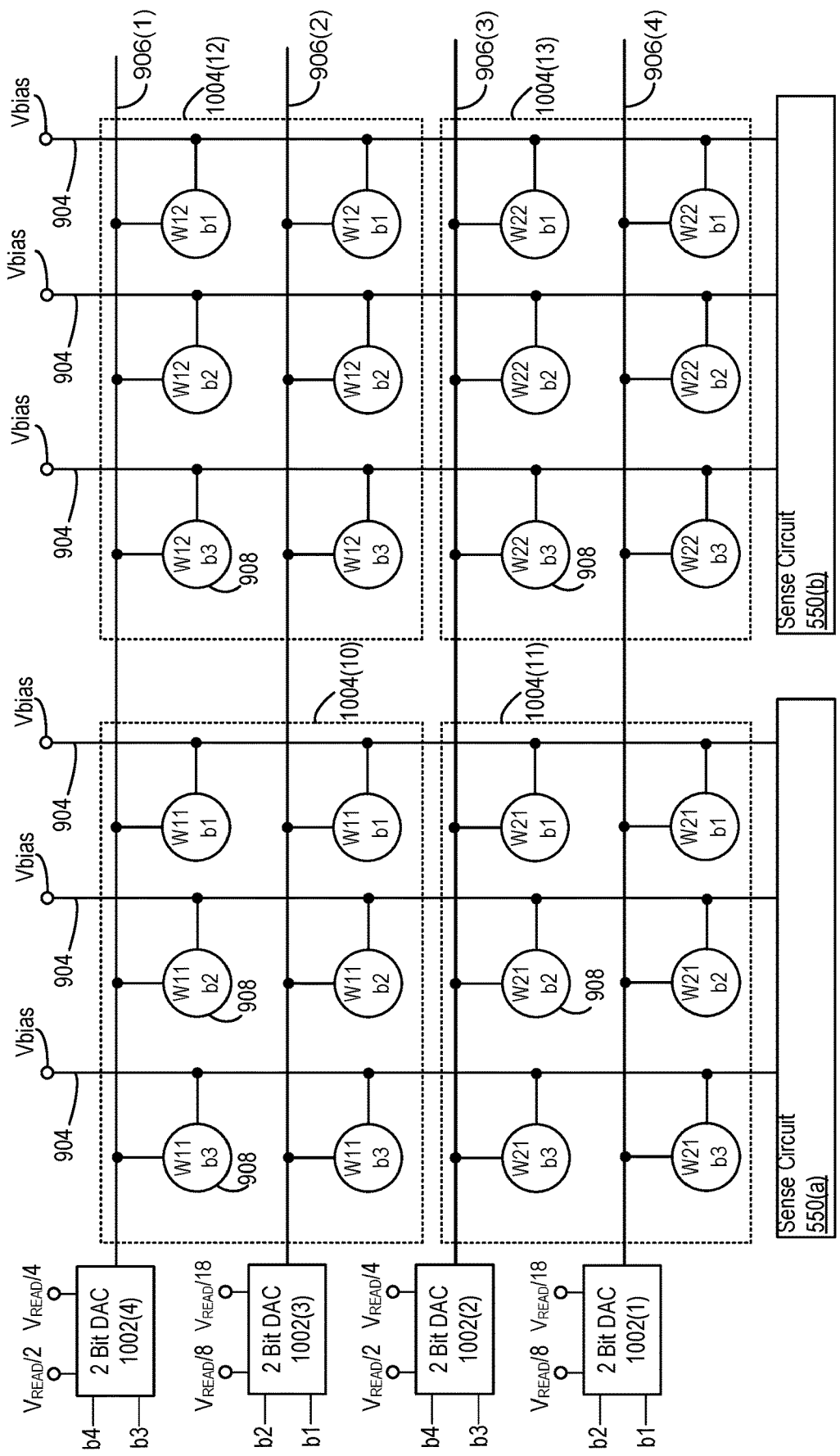
FIG. 18 is one embodiment of an apparatus that may be used to perform vector/matrix multiplication, and in which the input resolution is configurable.

As noted above, in some embodiments, in-memory computing is used to perform vector/matrix multiplication. FIG. 18 is one embodiment of an apparatus that may be used to perform vector/matrix multiplication, and in which the input resolution is configurable. For example, the resolution of elements in the input vector is configurable. FIG. 18 is similar to the example in FIG. 12 in which 4-bit resolution is provided. However, instead of two memory cell nodes as in FIG. 12, there are four memory cell nodes in FIG. 18. There may be many more memory cell nodes than depicted in FIG. 18.

Weight W11 is stored in memory cell node 1004(10). Weight W21 is stored in memory cell node 1004(11). Similar to the example of FIG. 12, the same weight W11 is stored in each row of the memory cell node 1004(10). Weight W12 is stored in memory cell node 1004(12). The same weight W12 is stored in each row of the memory cell node 1004(11). Weight W21 is stored in memory cell node 1004(12). The same weight W21 is stored in each row of the memory cell node 1004(12). Weight W22 is stored in memory cell node 1004(13). The same weight W22 is stored in each row of the memory cell node 1004(13). In this example, each weight is represented by three bits (b1, b2, b3).

Sense circuit 550a is used to sense bit line currents from bit lines connected to memory cell node 1004(10) and memory cell node 1004(11). Sense circuit 550b is used to sense bit line currents from bit lines connected to memory cell node 1004(12) and memory cell node 1004(13). The results from sense circuit 550a and sense circuit 550b may be used as results of vector/matrix multiplication.

FIG. 19 is a schematic diagram of one embodiment of a portion of the sense circuit 550. The sense circuit 550 may be used in the sense circuits of FIG. 12 or 18 to provide for multi-bit weights. The sense circuit 550 of FIG. 19 has a first multiply current mirror 1940(1) that may be used to implement multiplier 1240(1), second multiply current mirror 1940(3) that may be used to implement multiplier 1240(2), and third multiply current mirror 1940(3) that may be used to implement multiplier 1240(3). The sense circuit 550 of FIG. 18 has a summing current mirror 1940(4) that may be used to implement summer 1250.

The first, second, and third multiply current mirrors 1940(1), 1940(2) and 1940(3) each receive a current from one of the bit lines 904. The first multiply current mirror 1940(1) has transistor T1 and transistor T2. The second current mirror 1940(2) has transistor T3 and transistor T4. The third current mirror 1940(3) has transistor T5 and transistor T6. The fourth current mirror 1940(4) has transistor T7 and transistor T8. In one embodiment, transistors T1, T2, T3, T5, T7, and T8 are each the same size. Transistors T1, T2, T3, T5, T7, and T8 each have the same width-to-length ratio (W/L), in one embodiment. However, transistor T4 may have twice the W/L of transistors T1, T2, T3, T5, T7, and T8. Further, transistor T6 may have four times the W/L of transistors T1, T2, T3, T5, T7, and T8.

Transistor T1 in multiply current mirror 1940(1) receives a current "I_b1". Transistor T1 is connected to one of the second conductive lines in order to receive current "I_b1".

For example, with respect to FIG. 12, transistor T1 may be connected to bit line 904(3). Due to the current mirror configuration, the current "I_b1" in transistor T1 is mirrored to transistor T2. Thus, the first current mirror 1940(1) multiplies the current "I_b1" by "1".

Transistor T3 in multiply current mirror 1940(2) receives a current "I_b2". Transistor T3 is connected to one of the second conductive lines in order to receive current "I_b2". For example, with respect to FIG. 12, transistor T3 may be connected to bit line 904(2). As noted above, the W/L of transistor T4 is twice that of transistor T3, in one embodiment. Due to the current mirror configuration, the current in transistor T4 is 2*I_b2. Thus, due to the current mirror configuration, the current "I_b2" from the second conductive line is multiplied by two. Thus, the second current mirror 1940(2) multiplies the current "I_b2" by "2".

Transistor T5 in multiply current mirror 1940(3) receives a current "I_b3". Transistor T5 is connected to one of the second conductive lines in order to receive current "I_b3". For example, with respect to FIG. 12, transistor T5 may be connected to bit line 904(1). As noted above, the W/L of transistor T6 is four times that of transistor T5, in one embodiment. Due to the current mirror configuration, the current in transistor T6 is 4*I_b3. Thus, due to the current mirror configuration, the current "I_b3" from the second conductive line is multiplied by four. Thus, the third current mirror 1940(3) multiplies the current "I_b3" by "4".

Transistor T7 in the summing current mirror 1950 is connected to transistors T2, T4, and T6. Therefore, transistor T7 receives the combined currents from transistors T2, T4, and T6. The current from transistor T7 is mirrored to transistor T8. Thus, the current in transistor T8 is given by Equation 1.

$$I\_sum = 4*I\_b3 + 2*I\_b2 + I\_b1 \qquad \text{Eq. 1}$$

Multiply current mirrors 1940(1), 1940(2), and 1940(3) multiply their respective currents while summing current mirror 1940(4) sums the multiplied results from current mirrors 1940(1), 1940(2), and 1940(3), and outputs I_sum. Thus, I_sum can be produced without delays that could otherwise be incurred by converting the currents I_b1, I_b2, and I_b3 to digital signals, in order to process the currents.

The sense circuit 550 can be designed to reduce the impacts of noise and/or distortion to an acceptable level. The level of noise that is acceptable will depend on the application. One technique to reduce the impact of noise and/or distortion is to increase the size of the transistors T1-T8. For example, the length of the transistors T1-T8 can be increased to decrease the impact of noise.

A first embodiment includes an apparatus comprising a plurality of voltage sources in communication with a plurality of memory cells. Each voltage source is configured to input an n-bit digital control signal and one or more input voltages. Each voltage source is configured to output $2^n$ unique output voltage magnitudes based on the n-bit digital control signal and the one or more input voltages, wherein n is an integer greater than zero. The apparatus further comprises one or more control circuits in communication with the plurality of voltage sources and with the plurality of memory cells. The one or more control circuits are configured to issue digital control signals to the plurality of voltage sources to operate the voltage sources to have a first output voltage resolution having a first number of unique output voltage magnitudes. The one or more control circuits are configured to perform a first multiplication based on the first number of unique output voltage magnitudes and first states of the memory cells, and provide a first result of the first multiplication. The one or more control circuits are configured to issue digital control signals to the plurality of voltage sources to operate the voltage sources to have a second output voltage resolution having a second number of unique output voltage magnitudes. The second output voltage resolution has a different number of unique voltage values than the first output voltage resolution. At least one of the first number of unique voltages or the second number of unique voltages is greater than $2^n$. The one or more control circuits are configured to perform a second multiplication based on the second number of unique output voltage magnitudes and second states of the memory cells, and provide a second result of the second multiplication.

In a second embodiment, in furtherance of the first embodiment, the one or more control circuits are further configured to provide an n-bit digital control signal to m of the voltage sources to cause the m voltage sources to output $m*(2^n)$ unique output voltage magnitudes to achieve the first output voltage resolution, wherein m is an integer greater than zero. The one or more control circuits are further configured to provide an n-bit digital control signal to p*m of the voltage sources to cause the p*m voltage sources to output $p*m*(2^n)$ unique output voltage magnitudes to achieve the second output voltage resolution, wherein p is an integer greater than one.

In a third embodiment, in furtherance of the first or second embodiments, the one or more control circuits are further configured to perform the multiplication based on applying the first number of unique output voltage magnitudes to first memory cell nodes having a first number of the memory cells. The one or more control circuits are further configured to perform the multiplication based on applying the second number of unique output voltage magnitudes to second memory cell nodes having a second number of the memory cells, wherein the second number of the memory cells is different from the first number of the memory cells.

In a fourth embodiment, in furtherance of any of the first to third embodiments, the one or more control circuits are further configured to organize the voltage sources into first voltage source nodes having a first number of voltage sources, wherein each first voltage source node provides voltages for a first memory cell node. The one or more control circuits are further configured to organize the voltage sources into second voltage source nodes having a second number of voltage sources, wherein each second voltage source node provides voltages for a second memory cell node.

In a fifth embodiment, in furtherance of any of the first to fourth embodiments, each first memory cell node comprises one or more first rows of one or more of the memory cells, wherein each first row receives a voltage from one of the voltage sources. Each second memory cell node comprises one or more second rows of one or more of the memory cells, wherein each second row receives a voltage from one of the voltage sources, wherein the number of second rows is different from the number of first rows.

In a sixth embodiment, in furtherance of the fifth embodiment, the one or more control circuits are further configured to program each of the first rows of the memory cells in each first memory cell node to the same first weight of a first weight matrix. The one or more control circuits are further configured to program each of the second rows of the memory cells in each second memory cell node to the same second weight of a second weight matrix.

In a seventh embodiment, in furtherance of the first embodiment, the one or more control circuits are further configured to provide an n-bit digital control signal to each voltage source for each of m cycles to cause each voltage source to output m*(2^n) unique output voltage magnitudes to achieve the first output voltage resolution, wherein m is an integer greater than zero. The one or more control circuits are further configured to provide an n-bit digital control signal to each voltage source for each of p*m cycles to cause each voltage source to output p*m*(2^n) unique output voltage magnitudes to achieve the second output voltage resolution, wherein p is an integer greater than one.

In an eighth embodiment, in furtherance of the seventh embodiment, the one or more control circuits are further configured to provide a different set of one or more voltages to each voltage source for each of the m cycles to cause each voltage source to output the m*(2^n) unique output voltage magnitudes. The one or more control circuits are further configured to provide a different set of one or more voltages to each voltage source for each of the p*m cycles to cause each voltage source to output the p*m*(2^n) unique output voltage magnitudes.

In a ninth embodiment, in furtherance of the first to eighth embodiments, the one or more control circuits are further configured to store a single bit of information into each of the memory cells to program the state of the memory cell.

In a tenth embodiment, in furtherance of the first to ninth embodiments, the apparatus further comprises further comprises a cross-point array, wherein the plurality of memory cells comprise non-volatile memory cells in the cross point array.

In a tenth embodiment, in furtherance of the first to ninth embodiments, the one or more control circuits are further configured to program a weight matrix into the plurality of memory cells. The one or more control circuits are further configured to operate the voltage sources to have the first output voltage resolution in order to represent a first input vector with a first input resolution. The one or more control circuits are further configured to operate the voltage sources to have the second output voltage resolution in order to represent a second input vector with a second input resolution.

One embodiment includes a method of performing in-memory multiplication. The method comprises accessing a target voltage resolution for a plurality of memory cell nodes that are organized in a cross-point array having bit lines, wherein each memory cell node comprises one or more memory cells, wherein each memory cell node is connected to one of the bit lines. The method further comprises storing a weight into each memory cell node of the plurality of memory cell nodes. The method further comprises providing voltages and bits to a plurality of digital-to-analog converters (DACs) to apply a voltage having the target voltage resolution to each memory cell node, wherein the target voltage resolution is greater than an individual voltage resolution of the DACs. The method further comprises sensing one or more bit line currents that result from applying the voltage to each memory cell node. The method further comprises providing a multiplication result based on the sensed one or more bit line currents, wherein the multiplication result is based on the weight stored in each memory cell node and the voltage having the target voltage resolution applied to each memory cell node.

One embodiment includes a non-volatile storage system, comprising a plurality of non-volatile memory cells organized in a cross-point array, a plurality of digital-to-analog converters (DAC) in communication with the plurality of non-volatile memory cells, and one or more control circuits in communication with the plurality of DACs and the cross-point array. Each DAC is configured to input n-bits and one or more input voltages, wherein each DAC is configured to output 2^n unique output voltage magnitudes based on the n-bits and the one or more input voltages. The one or more control circuits are configured to program memory cell nodes that each comprise one or more non-volatile memory cells of the plurality of non-volatile memory cells, including program a bit of information into each non-volatile memory cell. The one or more control circuits are configured to operate the plurality of DACs to have a target input bit resolution, wherein the target input bit resolution is greater than n-bits. The one or more control circuits are configured to sense the memory cell nodes in response to voltages provided to the memory cell nodes by the plurality of DACs. The one or more control circuits are configured to provide one or more multiplication results based on sensing the memory cell nodes.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
a plurality of voltage sources in communication with a plurality of memory cells, wherein each voltage source is configured to input an n-bit digital control signal and one or more input voltages, wherein each voltage source is configured to output 2^n unique output voltage magnitudes based on the n-bit digital control signal and the one or more input voltages, wherein n is an integer greater than zero; and
one or more control circuits in communication with the plurality of voltage sources and with the plurality of memory cells, wherein the one or more control circuits are configured to:

issue digital control signals to the plurality of voltage sources to operate the voltage sources to have a first output voltage resolution having a first number of unique output voltage magnitudes;

perform a first multiplication based on the first number of unique output voltage magnitudes and first states of the memory cells, and provide a first result of the first multiplication;

issue digital control signals to the plurality of voltage sources to operate the voltage sources to have a second output voltage resolution having a second number of unique output voltage magnitudes, wherein the second output voltage resolution has a different number of unique voltage values than the first output voltage resolution, wherein at least one of the first number of unique voltages or the second number of unique voltages is greater than $2^n$; and perform a second multiplication based on the second number of unique output voltage magnitudes and second states of the memory cells, and provide a second result of the second multiplication.

2. The apparatus of claim 1, wherein the one or more control circuits are further configured to:

provide an n-bit digital control signal to m of the voltage sources to cause the m voltage sources to output $m*(2^n)$ unique output voltage magnitudes to achieve the first output voltage resolution, wherein m is an integer greater than zero; and provide an n-bit digital control signal to p*m of the voltage sources to cause the p*m voltage sources to output $p*m*(2^n)$ unique output voltage magnitudes to achieve the second output voltage resolution, wherein p is an integer greater than one.

3. The apparatus of claim 1, wherein the one or more control circuits are further configured to:

perform the multiplication based on applying the first number of unique output voltage magnitudes to first memory cell nodes having a first number of the memory cells; and perform the multiplication based on applying the second number of unique output voltage magnitudes to second memory cell nodes having a second number of the memory cells, wherein the second number of the memory cells is different from the first number of the memory cells.

4. The apparatus of claim 3, wherein the one or more control circuits are further configured to:

organize the voltage sources into first voltage source nodes having a first number of voltage sources, wherein each first voltage source node provides voltages for a first memory cell node; and organize the voltage sources into second voltage source nodes having a second number of voltage sources, wherein each second voltage source node provides voltages for a second memory cell node.

5. The apparatus of claim 4, wherein:

each first memory cell node comprises one or more first rows of one or more of the memory cells, wherein each first row receives a voltage from one of the voltage sources; and each second memory cell node comprises one or more second rows of one or more of the memory cells, wherein each second row receives a voltage from one of the voltage sources, wherein the number of second rows is different from the number of first rows.

6. The apparatus of claim 5, wherein the one or more control circuits are further configured to:

program each of the first rows of the memory cells in each first memory cell node to the same first weight of a first weight matrix; and program each of the second rows of the memory cells in each second memory cell node to the same second weight of a second weight matrix.

7. The apparatus of claim 1, wherein the one or more control circuits are further configured to:

provide an n-bit digital control signal to each voltage source for each of m cycles to cause each voltage source to output $m*(2^n)$ unique output voltage magnitudes to achieve the first output voltage resolution, wherein m is an integer greater than zero; and provide an n-bit digital control signal to each voltage source for each of p*m cycles to cause each voltage source to output $p*m*(2^n)$ unique output voltage magnitudes to achieve the second output voltage resolution, wherein p is an integer greater than one.

8. The apparatus of claim 7, wherein the one or more control circuits are further configured to:

provide a different set of one or more voltages to each voltage source for each of the m cycles to cause each voltage source to output the $m*(2^n)$ unique output voltage magnitudes; and provide a different set of one or more voltages to each voltage source for each of the p*m cycles to cause each voltage source to output the $p*m*(2^n)$ unique output voltage magnitudes.

9. The apparatus of claim 1, wherein the one or more control circuits are further configured to:

store a single bit of information into each of the memory cells to program the state of the memory cell.

10. The apparatus of claim 1, further comprising:

a cross-point array, wherein the plurality of memory cells comprise non-volatile memory cells in the cross point array.

11. The apparatus of claim 1, wherein the one or more control circuits are further configured to:

program a weight matrix into the plurality of memory cells;

operate the voltage sources to have the first output voltage resolution in order to represent a first input vector with a first input resolution; and operate the voltage sources to have the second output voltage resolution in order to represent a second input vector with a second input resolution.

12. A method of performing in-memory multiplication, the method comprising:

accessing a target voltage resolution for a plurality of memory cell nodes that are organized in a cross-point array having bit lines, wherein each memory cell node comprises one or more memory cells, wherein each memory cell node is connected to one of the bit lines;

storing a weight into each memory cell node of the plurality of memory cell nodes;

providing voltages and bits to a plurality of digital-to-analog converters (DACs) to apply a voltage having the target voltage resolution to each memory cell node, wherein the target voltage resolution is greater than an individual voltage resolution of the DACs;

sensing one or more bit line currents that result from applying the voltage to each memory cell node; and providing a multiplication result based on the sensed one or more bit line currents, wherein the multiplication result is based on the weight stored in each memory cell node and the voltage having the target voltage resolution applied to each memory cell node.

13. The method of claim 12, wherein providing the voltages and the bits to the plurality of DACs to apply the voltage having the target voltage resolution comprises providing the voltages and the bits to a first set of DAC nodes each having a first number of DACs in response to the target voltage resolution having a first resolution, wherein each DAC node in the first set outputs a first number of unique voltage magnitudes to provide a first target voltage resolution to a memory cell node; and further comprising:
    providing voltages and bits to a second set of DAC nodes each having a second number of DACs in response to the target voltage resolution having a second resolution, wherein each DAC node in the second set outputs a second number of unique voltage magnitudes to provide a second target voltage resolution to a memory cell node, wherein the second resolution is different than the first resolution, wherein the second number of DACs is different than the first number of DACs.

14. The method of claim 12, wherein providing the voltages and the bits to the plurality of DACs to apply the voltage having the target voltage resolution comprises providing the voltages and the bits to the plurality of DACs over a first number of cycles in response to the target voltage resolution having a first resolution, wherein each DAC outputs a first number of unique voltage magnitudes over the first number of cycles to provide a first target voltage resolution to a memory cell node; and further comprising:
    providing voltages and bits to the plurality of DACs over a second number of cycles in response to the target voltage resolution having a second resolution, wherein each DAC outputs a second number of unique voltage magnitudes over the second number of cycles to provide a second target voltage resolution to a memory cell node, wherein the second resolution is different than the first resolution, wherein the second number of cycles is different than the first number of cycles.

15. A non-volatile storage system, comprising:
    a plurality of non-volatile memory cells organized in a cross-point array;
    a plurality of digital-to-analog converters (DAC) in communication with the plurality of non-volatile memory cells, wherein each DAC is configured to input n-bits and one or more input voltages, wherein each DAC is configured to output $2^n$ unique output voltage magnitudes based on the n-bits and the one or more input voltages; and
    one or more control circuits in communication with the plurality of DACs and the cross-point array, wherein the one or more control circuits are configured to:
        program memory cell nodes that each comprise one or more non-volatile memory cells of the plurality of non-volatile memory cells, including program a bit of information into each non-volatile memory cell;
        operate the plurality of DACs to have a target input bit resolution, wherein the target input bit resolution is greater than n-bits;
        sense the memory cell nodes in response to voltages provided to the memory cell nodes by the plurality of DACs; and
        provide one or more multiplication results based on sensing the memory cell nodes.

16. The non-volatile storage system of claim 15, wherein the one or more control circuits are further configured to:
    operate a first set of DAC nodes each having a first number of DACs to collectively have a first target input bit resolution that is greater than n-bits; and
    operate a second set of DAC nodes each having a second number of DACs to collectively have a second target input bit resolution that is different than n-bits, wherein the second number of DACs is different than the first number of DACs.

17. The non-volatile storage system of claim 16, wherein the one or more control circuits are further configured to:
    organize the non-volatile memory cells into first memory cell nodes such that each first memory cell node receives voltages from a DAC node in the first set of DAC nodes to provide the first target input bit resolution; and
    organize the non-volatile memory cells into second memory cell nodes such that each second memory cell node receives voltages from a DAC node in the second set of DAC nodes to provide the second target input bit resolution.

18. The non-volatile storage system of claim 15, wherein the one or more control circuits are further configured to:
    operate each of the DACs over a first number of cycles to have a first target input bit resolution that is greater than n-bits; and
    operate each of the DACs over a second number of cycles to have a second target input bit resolution that is different than n-bits, wherein the second number of cycles is different than the first number of cycles.

19. The non-volatile storage system of claim 15, wherein:
the cross-point array comprises a plurality of word lines;
each DAC provides a voltage to one of the word lines; and
the one or more control circuits are further configured to select the number of word lines to which a memory cell node is connected based on the target input bit resolution.

20. The non-volatile storage system of claim 19, wherein the one or more control circuits are further configured to:
    store the same weight of a weight matrix in a memory cell node for each word line to which the memory cell node is connected.

\* \* \* \* \*